(12) United States Patent
Kobayashi et al.

(10) Patent No.: US 12,087,343 B2
(45) Date of Patent: Sep. 10, 2024

(54) MAGNETIC MEMORY DEVICE

(71) Applicant: Kioxia Corporation, Tokyo (JP)

(72) Inventors: Yosuke Kobayashi, Seoul (KR); Masayoshi Iwayama, Seoul (KR)

(73) Assignee: Kioxia Corporation, Tokyo (JP)

( * ) Notice: Subject to any disclaimer, the term of this patent is extended or adjusted under 35 U.S.C. 154(b) by 250 days.

(21) Appl. No.: 17/693,790

(22) Filed: Mar. 14, 2022

(65) Prior Publication Data

US 2023/0088745 A1   Mar. 23, 2023

(30) Foreign Application Priority Data

Sep. 17, 2021   (JP) ................................ 2021-151861

(51) Int. Cl.
| | | |
|---|---|---|
| *G11C 16/04* | (2006.01) | |
| *G11C 11/16* | (2006.01) | |
| *H10B 61/00* | (2023.01) | |
| *H10N 50/80* | (2023.01) | |

(52) U.S. Cl.
CPC ........ *G11C 11/1675* (2013.01); *G11C 11/161* (2013.01); *G11C 11/1673* (2013.01); *H10B 61/00* (2023.02); *H10N 50/80* (2023.02)

(58) Field of Classification Search
CPC .............. G11C 11/1675; G11C 11/161; G11C 11/1673
See application file for complete search history.

(56) References Cited

U.S. PATENT DOCUMENTS

| | | | |
|---|---|---|---|
| 6,778,429 B1 | 8/2004 | Lu et al. | |
| 8,331,136 B2 | 12/2012 | Ohmori et al. | |
| 9,147,458 B2 * | 9/2015 | Noguchi | G11C 11/1675 |
| 9,472,256 B1 * | 10/2016 | Andre | G11C 11/1673 |
| 11,074,954 B2 * | 7/2021 | Osada | G11C 11/1697 |
| 2020/0302989 A1 | 9/2020 | Osada et al. | |

FOREIGN PATENT DOCUMENTS

| | | |
|---|---|---|
| JP | 5287544 B2 | 9/2013 |
| JP | 2020155186 A | 9/2020 |

* cited by examiner

*Primary Examiner* — Pho M Luu
(74) *Attorney, Agent, or Firm* — Holtz, Holtz & Volek PC

(57) ABSTRACT

A magnetic memory device includes a first interconnect, a second interconnect, a memory cell, and a write circuit. The memory cell is electrically coupled between the first interconnect and the second interconnect, and includes a variable resistance element and a switching element. The write circuit supplies a write voltage from the current source circuit or the voltage source circuit to write data into the memory cell. The write circuit supplies the write voltage to one of the first interconnect and the second interconnect using the voltage source circuit during a first period ranging from a first time to a second time. The write circuit supplies the write voltage to one of the first interconnect and the second interconnect using the current source circuit during a second period ranging from a third time to a fourth time.

21 Claims, 22 Drawing Sheets

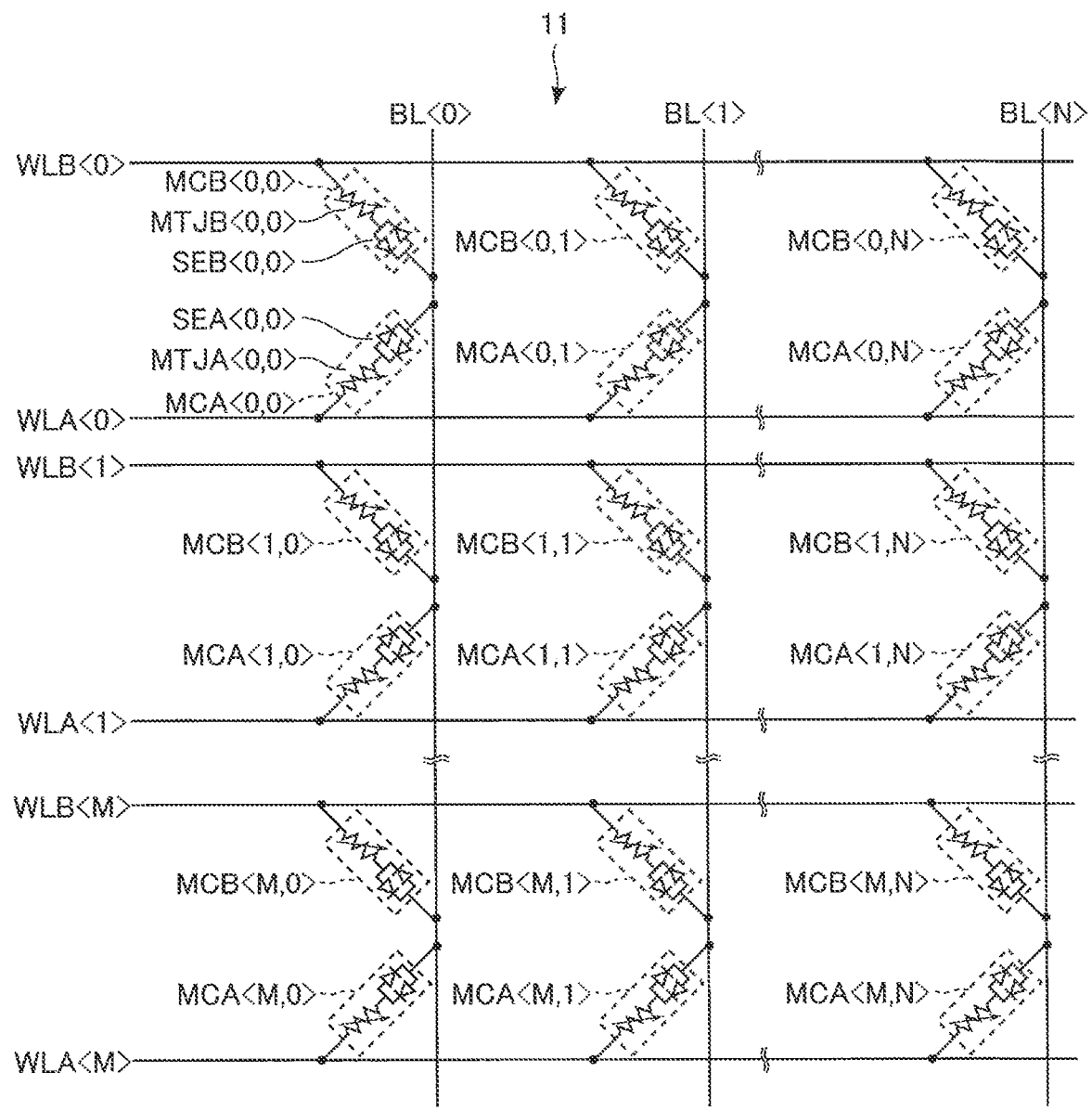
F I G. 2

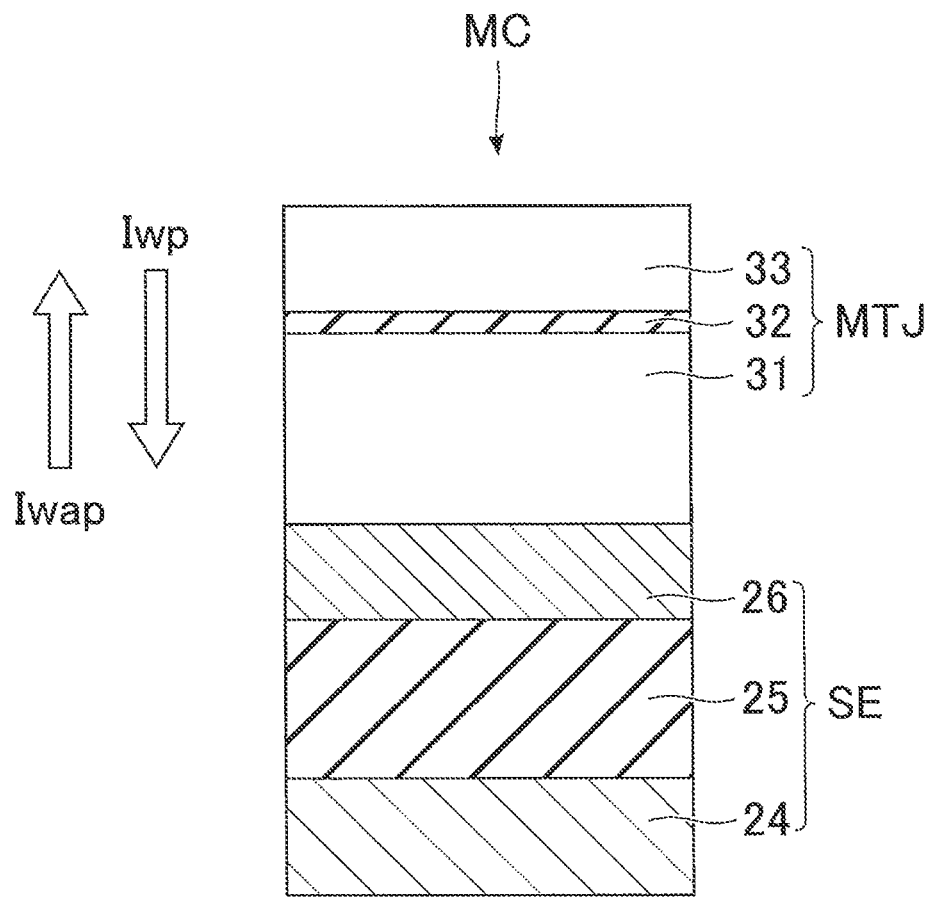
F I G. 6

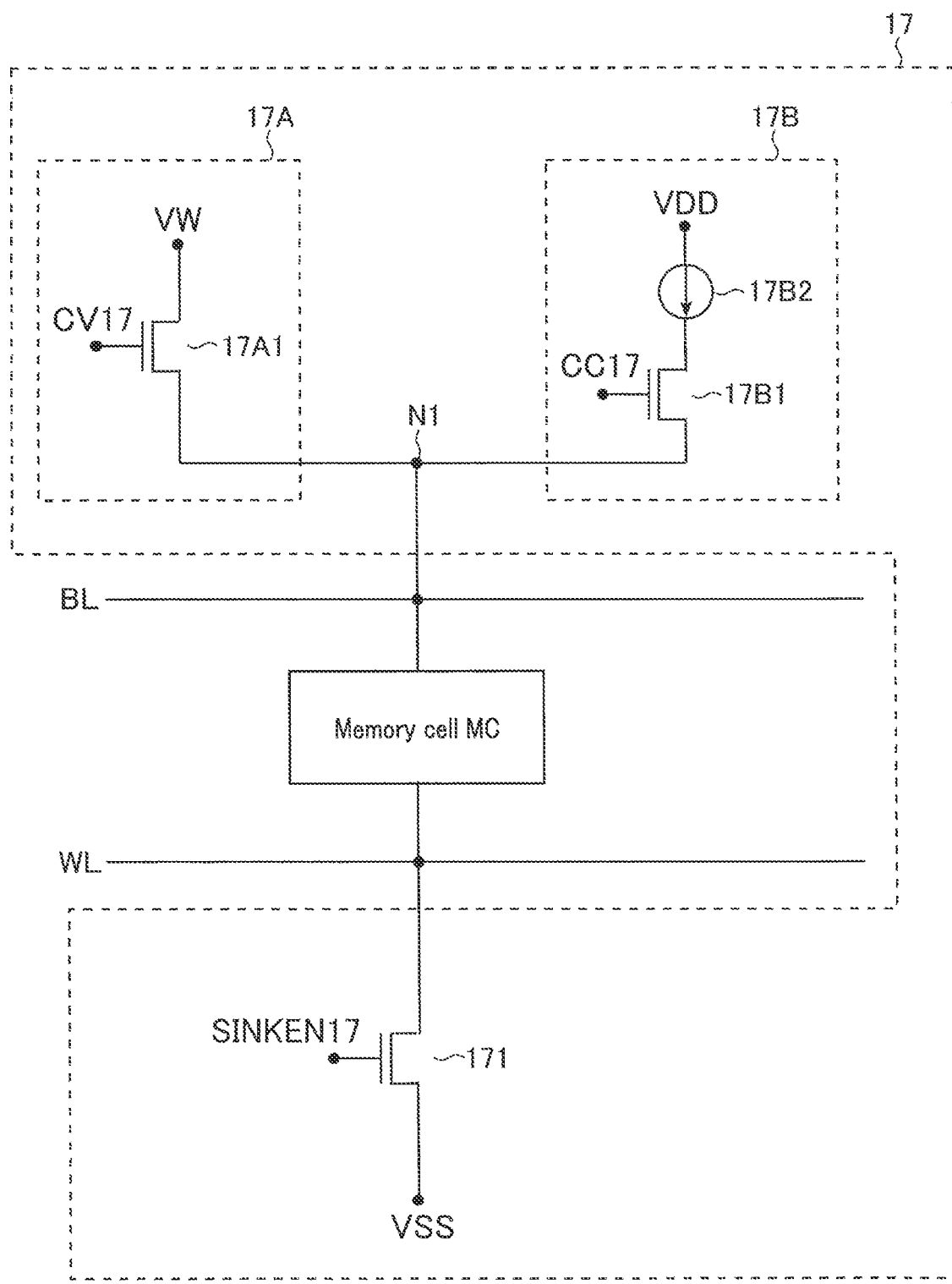
F I G. 7

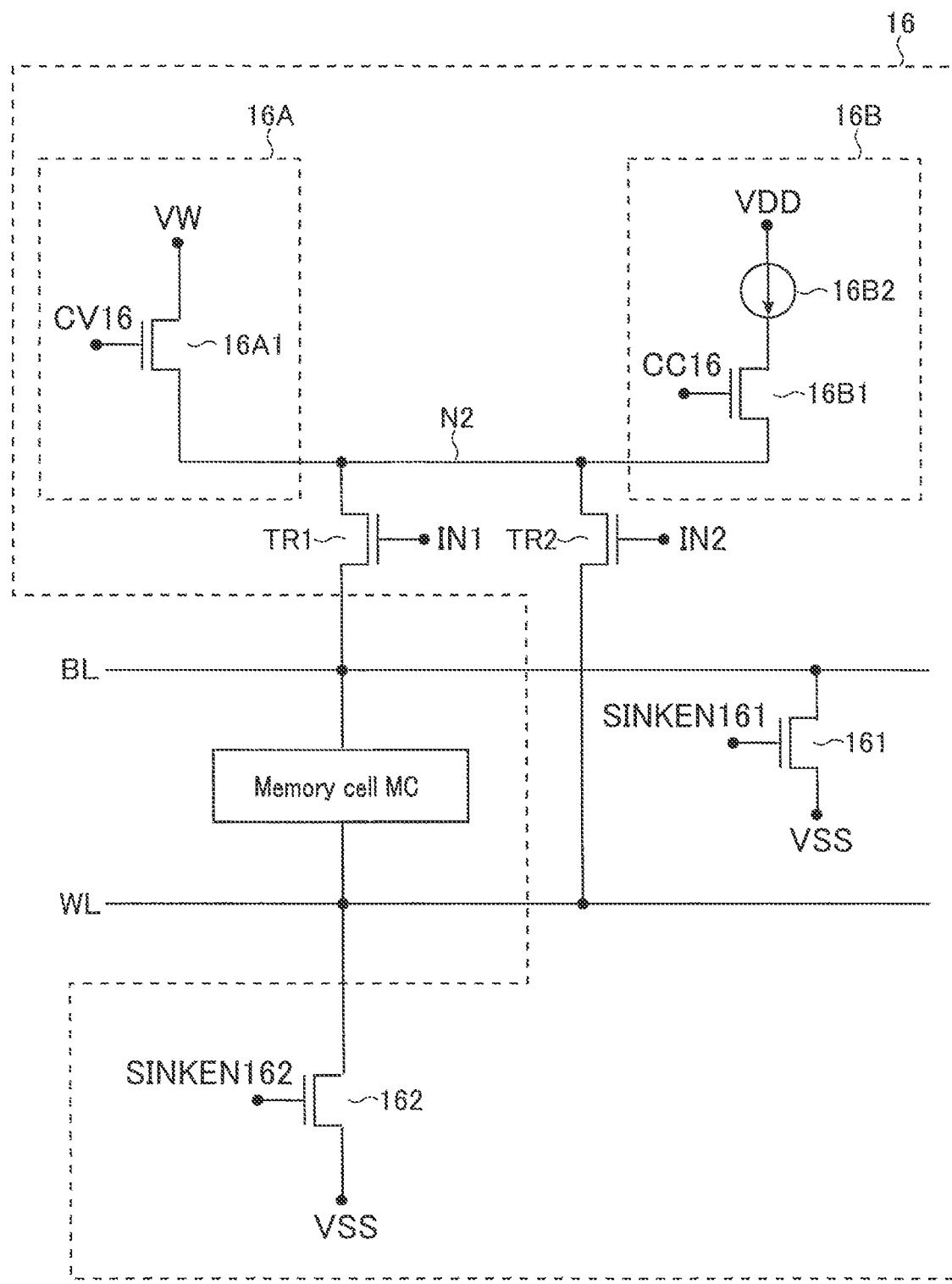
F I G. 8

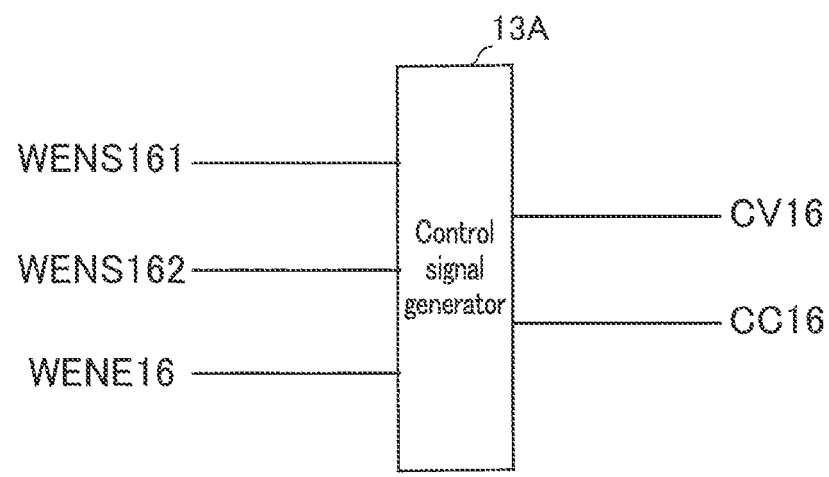
F I G. 10

MAGNETIC MEMORY DEVICE

CROSS-REFERENCE TO RELATED APPLICATIONS

This application is based upon and claims the benefit of priority from Japanese Patent Application No. 2021-151861, filed Sep. 17, 2021, the entire contents of which are incorporated herein by reference.

FIELD

Embodiments described herein relate generally to a magnetic memory device.

BACKGROUND

A memory device which uses a magnetoresistance effect element is known.

BRIEF DESCRIPTION OF THE DRAWINGS

FIG. 2 is a circuit diagram showing an example of a circuit configuration of a memory cell array included in the magnetic memory device according to the embodiment.

FIG. 6 shows an example of a cross-sectional structure of a memory cell array included in the magnetic memory device according to the embodiment.

FIG. 7 is a circuit diagram showing an example of a configuration and coupling of a read circuit in the magnetic memory device according to the embodiment.

FIG. 8 is a circuit diagram showing an example of a configuration and coupling of a write circuit in the magnetic memory device according to the embodiment.

FIG. 10 is a circuit diagram showing an example of a configuration of the control signal generator in the magnetic memory device according to the embodiment.

DETAILED DESCRIPTION

Figure 1:
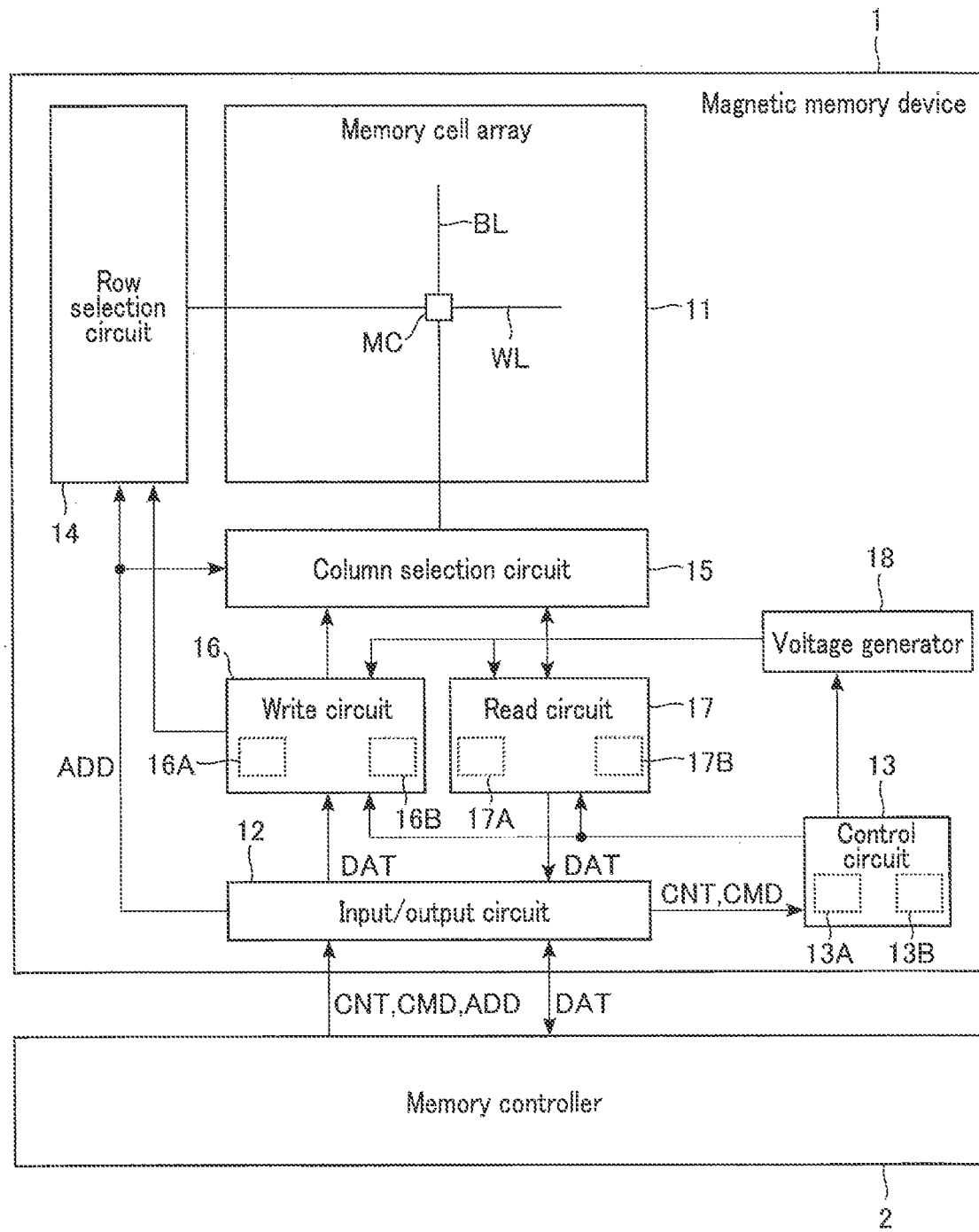
FIG. 1 is a block diagram showing a configuration example of a magnetic memory device according to an embodiment.

A magnetic memory device includes a first interconnect, a second interconnect, a memory cell, and a write circuit. The first interconnect extends in a first direction. The second interconnect extends in a second direction that intersects the first direction. The memory cell is electrically coupled between the first interconnect and the second interconnect, and includes a variable resistance element and a switching element. The write circuit includes a current source circuit and a voltage source circuit. The write circuit supplies a write voltage from the current source circuit or the voltage source circuit to write data into the memory cell. While a first voltage is applied to one of the first interconnect and the second interconnect, the write circuit supplies the write voltage to another of the first interconnect and the second interconnect using the voltage source circuit during a first period. The first period ranges from a first time to a second time. The first voltage is lower than the write voltage. The first time is a time when the supplying of the write voltage is started. The write circuit supplies the write voltage to another of the first interconnect and the second interconnect using the current source circuit during a second period. The second period ranges from a third time to a fourth time. The third time is later than the second time. The fourth time is a time when the supplying of the write voltage is stopped.

Hereinafter, embodiments will be described with reference to the drawings. Each embodiment illustrates a device and a method for embodying the technical idea of the embodiments. The drawings are either schematic or conceptual, and the dimensions, ratios, etc. of each drawing are not necessarily the same as the actual ones. The entire description of an embodiment is applicable as a description of another embodiment, unless otherwise expressly or implicitly excluded. The technical idea of the present embodiment is not designated by the shape, structure, arrangement, etc. of the components.

In the description that follows, components having an approximately identical function and configuration will be assigned an identical symbol. A numeral that follows letters constituting a reference symbol is used to distinguish between components referred to by reference symbols including the same letters and having a similar configuration. If components represented by reference symbols including the same letters need not be distinguished from each other, such components are referred to by reference symbols including only the same letters.

Hereinafter, an xyz orthogonal coordinate system will be used to describe embodiments. In the description that follows, the term "low" and its derivative and relevant terms refer to a position at a smaller coordinate on a z axis, and the term "up" and its derivative and relevant terms refer to a position at a larger coordinate on the z axis.

[1] Embodiment

[1-1] Structure (Configuration)

Hereinafter, a memory device according to an embodiment will be described.

[1-1-1] Overall Structure

FIG. 1 shows a functional block of a magnetic memory device according to the embodiment. As shown in FIG. 1, a magnetic memory device 1 is controlled by a memory controller 2. The magnetic memory device 1 is a memory device that stores data using a ferromagnet. The magnetic memory device 1 includes a memory cell array 11, an input/output circuit 12, a control circuit 13, a row selection circuit 14, a column selection circuit 15, a write circuit 16, a read circuit 17, and a voltage generator 18.

The memory cell array 11 is a collection of arrayed memory cells MC. The memory cells MC are capable of storing data in a non-volatile manner. In the memory cell array 11, a plurality of word lines WL and a plurality of bit lines BL are positioned. Each memory cell MC is coupled to a single word line WL and a single bit line BL. The word line WL is associated with a row. The bit line BL is associated with a column. Through selection of a single row and a single column, a single memory cell MC is designated.

The input/output circuit 12 is a circuit that inputs and outputs data and signals. The input/output circuit 12 receives, from the memory controller 2, a control signal CNT, a command CMD, an address signal ADD, and data (write data) DAT. The input/output circuit 12 transmits data (read data) DAT to the memory controller 2.

The row selection circuit 14 receives an address signal ADD from the input/output circuit 12, and sets a single word line WL associated with a row designated by the received address signal ADD to a selected state.

The column selection circuit 15 receives an address signal ADD from the input/output circuit 12, and sets one or more bit lines BL associated with a column designated by the received address signal ADD to a selected state.

The control circuit 13 receives, from the input/output circuit 12, a control signal CNT and a command CMD. The control circuit 13 controls the write circuit 16 and the read circuit 17 based on the command CMD and under the control instructed by the control signal CNT. Specifically, the control circuit 13 supplies a voltage used for data writing to the write circuit 16 during writing of data to the memory cell array 11. Also, the control circuit 13 supplies a voltage used for data reading to the read circuit 17 during data reading from the memory cell array 11. The control circuit 13 includes control signal generators 13A and 13B. The control signal generators 13A and 13B generate signals for controlling the write circuit 16 and the read circuit 17. A description of the control signal generators 13A and 13B will be given later.

The write circuit 16 receives the write data DAT from the input/output circuit 12, and supplies a voltage used for data writing to the row selection circuit 14 and the column selection circuit 15 based on the write data DAT and under the control of the control circuit 13.

The write circuit 16 includes a constant voltage circuit 16A and a constant current circuit 16B. A description of the constant voltage circuit 16A and the constant current circuit 16B will be given later.

The read circuit 17 reads data stored in a memory cell MC using a voltage used in data reading under the control of the control circuit 13. The read data is supplied to the input/output circuit 12 as the read data DAT. The read circuit 17 includes a sense amplifier.

The read circuit 17 includes a constant voltage circuit 17A and a constant current circuit 17B. A description of the constant voltage circuit 17A and the constant current circuit 17B will be given later.

The voltage generator 18 generates voltages used for data reading and writing under the control of the control circuit 13. The voltage generator 18 supplies the generated voltages to the write circuit 16 and the read circuit 17.

[1-1-2] Circuit Configuration of Memory Cell Array

FIG. 2 is a circuit diagram of the memory cell array 11 according to the embodiment. As shown in FIG. 2, in the memory cell array 11, M+1 (where M is a natural number) word lines WLA (WLA<0>, WLA<1>, ..., and WLA<M>) and M+1 word lines WLB (WLB<0>, WLB<1>, ..., and WLB<M>) are provided. In the memory cell array 11, N+1 (where N is a natural number) bit lines BL (BL<0>, BL<1>, ..., and BL<N>) are provided.

Each of a plurality of memory cells MC (MCA and MCB) includes a first node and a second node. Each memory cell MC is coupled to a single word line WL at the first node, and is coupled to a single bit line BL, at the second node. More specifically, the memory cells MCA include memory cells MCA<α,β> with respect to all the combinations of all the cases where α is an integer equal to or greater than 0 and equal to or less than M, and all the cases where β is an integer equal to or greater than 0 and equal to or less than N, and the memory cell MCA<α,β> is coupled between the word line WLA<α> and the bit line BL<β>. Similarly, the memory cells MCB include a memory cell MCB<α,β> with respect to all the combinations of all the cases where α is an integer equal to or greater than 0 and equal to or less than M, and all the cases where β is an integer equal to or greater than 0 and equal to or less than N, and the memory cell MCB<α,β> is coupled between the word line WLB<α> and the bit line BL<β>.

Each memory cell MC includes a single MTJ element MTJ (MTJA or MTJB) and a single switching element SE (SEA or SEB). More specifically, the memory cell MCA<α, β> includes an MTJ element MTJA<α,β> and a switching element SEA<α,β> with respect to all the combinations of all the cases where α is an integer equal to or greater than 0 and equal to or less than M, and all the cases where β is an integer equal to or greater than 0 and equal to or less than N. Furthermore, the memory cell MCB<α,β> includes an MTJ element MTJB<α,β> and a switching element SEB<α, β> with respect to all the combinations of all the cases where α is an integer equal to or greater than 0 and equal to or less than M and all the cases where β is an integer equal to or greater than 0 and equal to or less than N.

In each memory cell MC, the MTJ element MTJ and the switching element SE are coupled in series. The MTJ element MTJ is coupled to a single word line WL, and the switching element SE is coupled to a single bit line BL.

The MTJ element MTJ is an element that exhibits a tunneling magnetoresistance effect, and includes, for example, a magnetic tunnel junction (MTJ). The resistance of the MTJ element MTJ can be switched between a low-resistance state and a high-resistance state. The MTJ element MTJ is capable of storing 1-bit data using the difference in the two resistance states.

The switching element SE is an element for allowing selection of a memory cell MC in which the switching element SE is included. The switching element includes two terminals, and when a voltage less than a first threshold value is applied in a first direction between the two terminals, the switching element is in a high resistance state, for example, in an electrically non-conductive state (off state). On the other hand, when a voltage equal to or greater than the first threshold value is applied in the first direction between the two terminals, the switching element is in a low-resistance state, for example, in an electrically conductive state (on state). Furthermore, with respect to a second direction opposite to the first direction, the switching element has a function similar to the above-described switching function between a high-resistance state and a low-resistance state based on the magnitude of the voltage applied in the first direction. That is, the switching element is a bidirectional switching element. By turning on or off the switching element, it is possible to control whether or not a current is supplied to an MTJ element MTJ coupled to the switching element, namely, selection or non-selection of the MTJ element MTJ.

Figure 3:
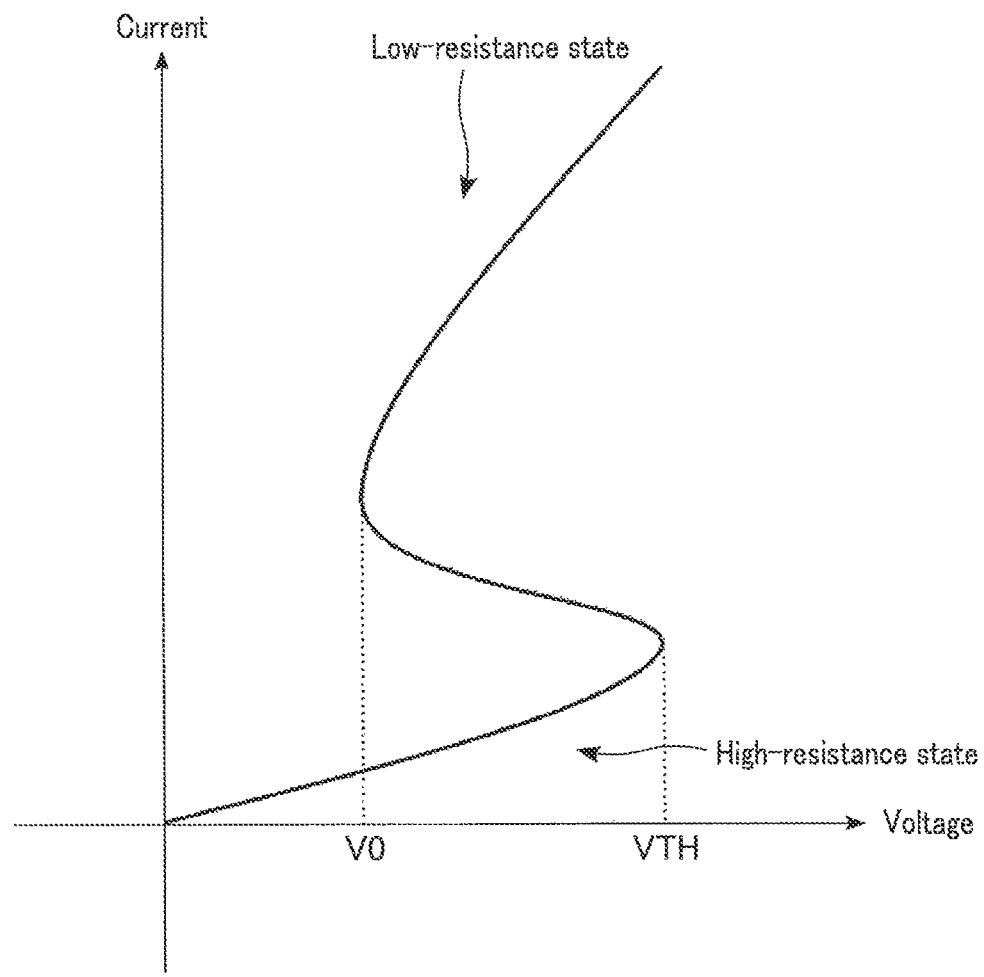
FIG. 3 is a characteristic diagram showing an example of a switching element.

The switching element SE described in the embodiment is similarly applicable to a switching element that has a characteristic of causing a rapid drop in a resistance value of a threshold voltage VTH of the switching element SE, resulting in a rapid drop in the application voltage and an increase (snapback) in the current, as shown in FIG. 3. A material composition used in a switching element with such characteristics may be suitably selected and used according to the characteristics of the memory cell MC.

[1-1-3] Structure of Memory Cell Array

Figure 4:
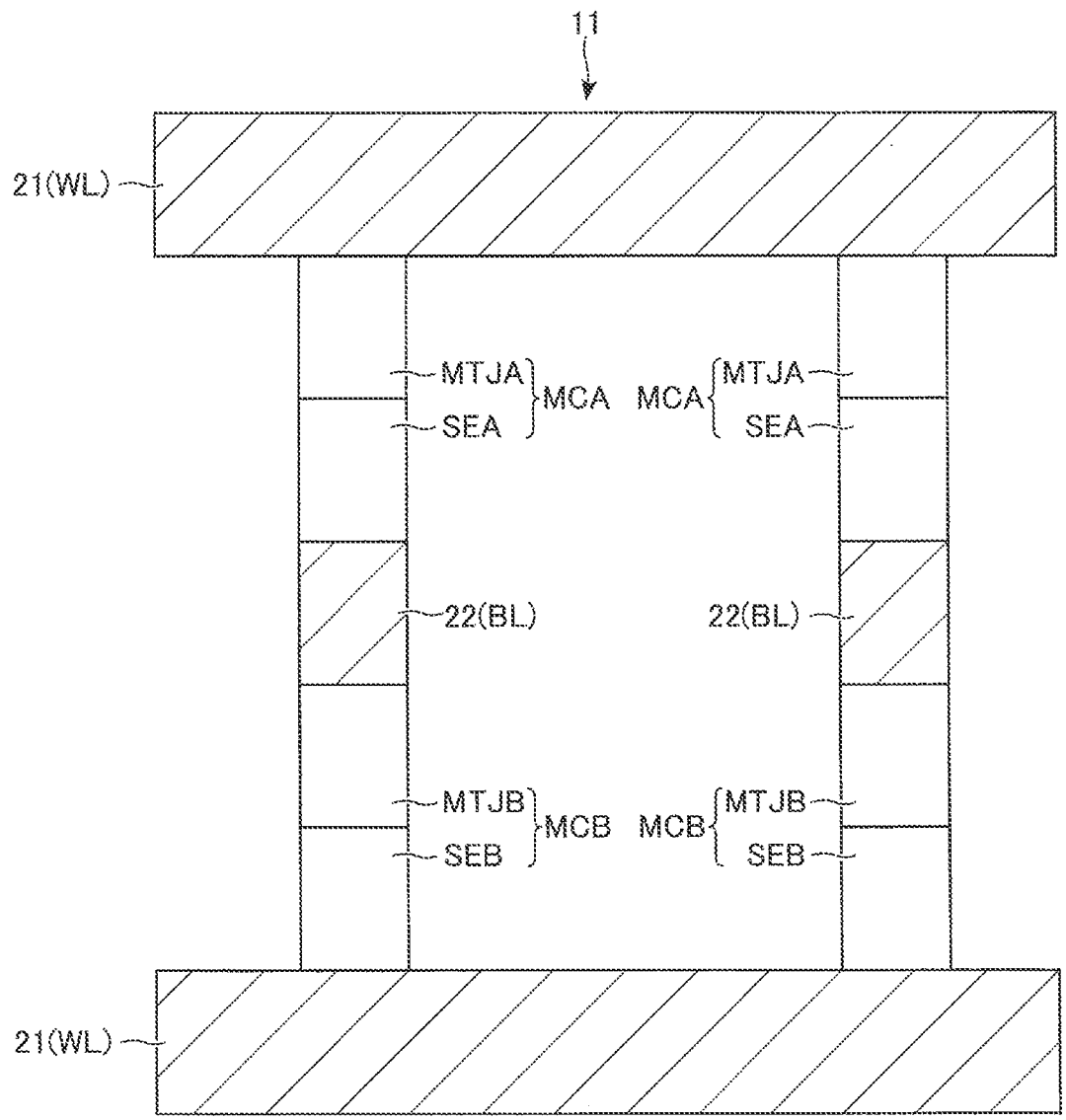
FIG. 4 shows an example of a cross-sectional structure of a memory cell array included in the magnetic memory device according to the embodiment.
Figure 5:
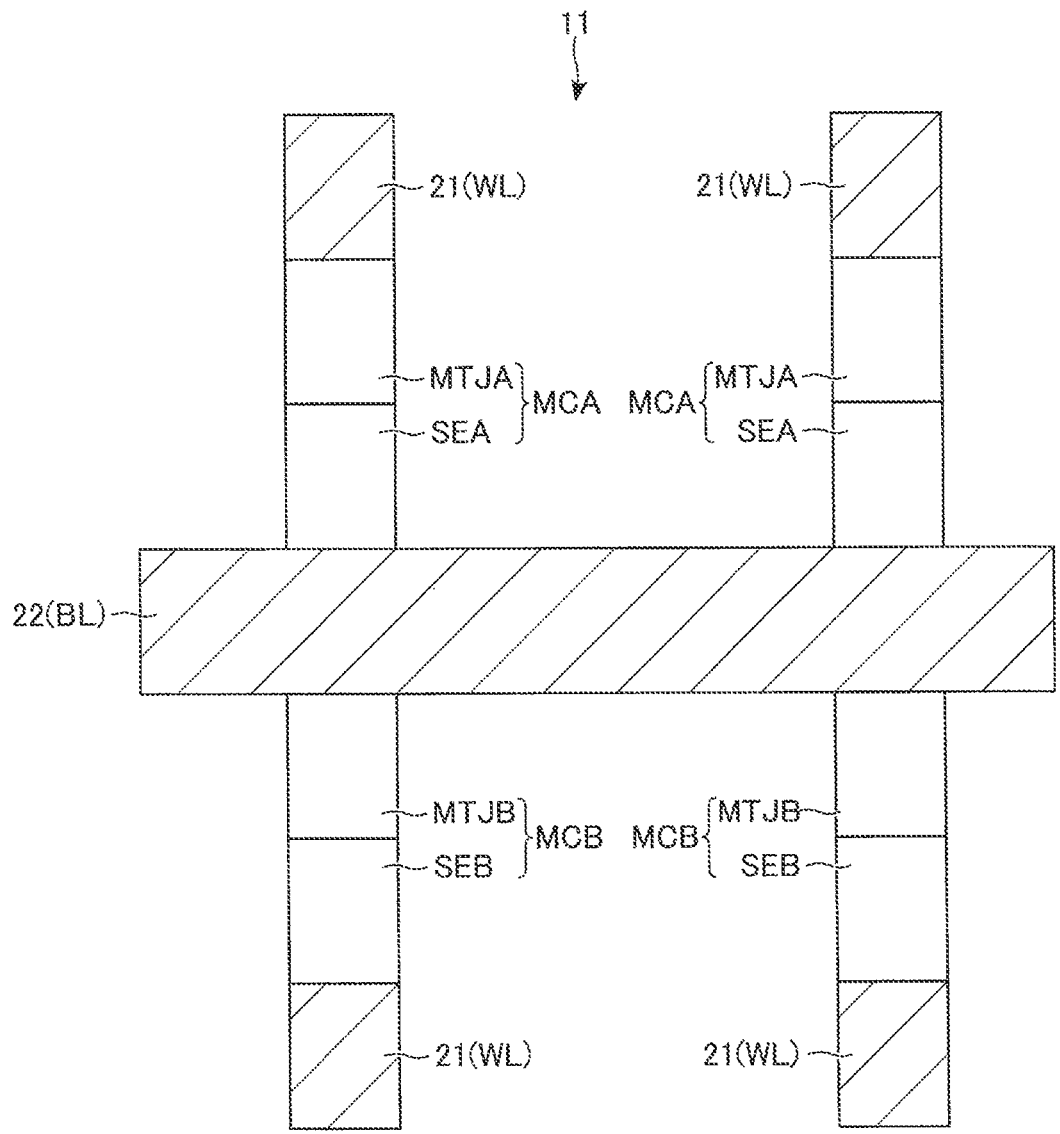
FIG. 5 shows an example of a cross-sectional structure of a memory cell array included in the magnetic memory device according to the embodiment.

Each of FIGS. 4 and 5 shows a cross-sectional structure of a part of the memory cell array 11 according to the embodiment. FIG. 4 shows a cross section taken along an xz plane, and FIG. 5 shows a cross section taken along a yz plane.

As shown in FIGS. 4 and 5, a plurality of conductors 21 are provided above a semiconductor substrate (not illustrated). The conductors 21 extend along a y axis, and are arranged along an x axis. Each conductor 21 functions as a single word line WL.

Each conductor 21 is coupled to, at its upper surface, upper surfaces of the respective memory cells MCB. Each memory cell MCB has, for example, a circular shape in an xy plane. The memory cells MCB are arranged along the y axis on each conductor 21, and are thereby arrayed in a matrix pattern along the xy plane. Each memory cell MCB includes a structure that functions as a switching element SEB, and a structure that functions as an MTJ element MTJB. Each of the structure that functions as the switching element SEB and the structure that functions as the MTJ element MTJB includes one or more layers, as will be described later.

A plurality of conductors 22 are provided above the memory cells MCB. The conductors 22 extend along the x axis, and are arranged along the y axis. Each conductor 22 is coupled to, at its lower surface, upper surfaces of the respective memory cells MCB arranged along the x axis. Each conductor 22 functions as a single bit line BL.

Each conductor 22 is coupled to, at its upper surface, lower surfaces of the respective memory cells MCA. Each memory cell MCA has, for example, a circular shape in an xy plane. The memory cells MCA are arranged along the x axis on each conductor 22, and are thereby arrayed in a matrix pattern along the xy plane. Each memory cell MCA includes a structure that functions as a switching element SEA, and a structure that functions as an MTJ element MTJA. Each of the structure that functions as the switching element SEA and the structure that functions as the MTJ element MTJA includes one or more layers, as will be described later.

A conductor 21 is further provided on an upper surface of each of the memory cells MCA arranged along the y axis.

By repeatedly providing, along the z axis, a structure extending from the conductor 21 at the lowermost layer to the layer of the memory cell MCA shown in FIGS. 4 and 5, it is possible to realize the memory cell array 11 shown in FIG. 2.

The memory cell array 11 further includes an interlayer insulator in a region in which the conductors 21, the conductors 22, and the memory cells MC are not provided.

FIG. 6 shows a cross section of an example structure of the memory cell MC according to the embodiment. As shown in FIG. 6, the switching element SE includes a lower electrode 24, a variable resistance material (layer) 25, and an upper electrode 26. The lower electrode 24 is positioned on an upper surface of the conductor 21 or 22 (not illustrated). The variable resistance material 25 is positioned on an upper surface of the lower electrode 24. The upper electrode 26 is positioned on an upper surface of the variable resistance material 25.

The lower electrode 24 and the upper electrode 26 contain or consist of, for example, titanium nitride (TiN).

The variable resistance material 25 is, for example, a two-terminal switching element, and a first terminal, which is one of the two terminals, is one of an upper surface and a bottom surface of the variable resistance material 25, and a second terminal, which is the other of the two terminals, is the other of the upper surface and the bottom surface of the variable resistance material 25. A single MTJ element MTJ is positioned on an upper surface of each upper electrode 26. The MTJ element MTJ includes a ferromagnetic layer 31, an insulating layer 32, and a ferromagnetic layer 33. For example, as shown in FIG. 6, the insulating layer 32 is positioned on an upper surface of the ferromagnetic layer 31, and the ferromagnetic layer 33 is positioned on an upper surface of the insulating layer 32.

The ferromagnetic layer 31 has a magnetization-easy axis which goes along a direction that penetrates interfaces of the ferromagnetic layer 31, the insulating layer 32, and the ferromagnetic layer 33, which is, for example, a magnetization easy axis of an angle equal to or greater than 45° and equal to or less than 90° with respect to the interfaces, and which is, for example, a magnetization easy axis that goes along a direction orthogonal to the interfaces. The magnetization direction of the ferromagnetic layer 31 is intended to be invariable even if data is read or written into or from the magnetic memory device 1. The ferromagnetic layer 31 can function as a so-called reference layer. The ferromagnetic layer 31 may include a plurality of ferromagnetic layers and/or conductive layers that are stacked on one another.

The insulating layer 32 contains, for example, oxygen and magnesium, or contains magnesium oxide (MgO), and functions as a so-called tunnel barrier.

The ferromagnetic layer 33 contains or consists of, for example, cobalt iron boron (CoFeB) or iron boride (FeB). The ferromagnetic layer 33 has a magnetization-easy axis which goes along a direction that penetrates interfaces of the ferromagnetic layer 31, the insulating layer 32, and the ferromagnetic layer 33, which is, for example, a magnetization easy axis of an angle equal to or greater than 45° and equal to or less than 90° with respect to the interfaces, and which is, for example, a magnetization easy axis that goes along a direction orthogonal to the interfaces. The orientation of magnetization of the ferromagnetic layer 33 can be varied by data writing, and the ferromagnetic layer 33 can function as a so-called storage layer.

When the orientation of magnetization of the ferromagnetic layer 33 is parallel to the orientation of magnetization of the ferromagnetic layer 31, the resistance of the MTJ element MTJ exhibits a low resistance. When the orientation of magnetization of the ferromagnetic layer 33 is antiparallel to the orientation of magnetization of the ferromagnetic layer 31, the resistance of the MTJ element MTJ exhibits a higher resistance than when the orientations of magnetization of the ferromagnetic layers 31 and 33 are antiparallel. A memory cell MC in a state in which the orientation of magnetization of the ferromagnetic layer 33 is parallel to the orientation of magnetization of the ferromagnetic layer 31 is referred to as being in a "P state". A memory cell MC in a state in which the orientation of magnetization of the ferromagnetic layer 33 is antiparallel to the orientation of magnetization of the ferromagnetic layer 31 is referred to as being in an "AP state".

When a write current Iwp of a certain magnitude flows from the ferromagnetic layer 33 toward the ferromagnetic layer 31, the orientation of magnetization of the ferromagnetic layer 33 becomes parallel to the orientation of magnetization of the ferromagnetic layer 31. Such an operation of inverting the orientation of magnetization may be referred to as "P writing". On the other hand, when a write current Iwap of another magnitude flows from the ferromagnetic layer 31 toward the ferromagnetic layer 33, the orientation of magnetization of the ferromagnetic layer 33 becomes antiparallel to the orientation of magnetization of the ferromagnetic layer 31. Such an operation of inverting the orientation of magnetization may be referred to as "AP writing". Hereinafter, the write current Iwp may be referred to as a "P write current", and the write current Iwap may be referred to as an "AP write current". The AP write current Iwap is larger than the P write current Iwp.

The memory cell MC may further include a conductor, an insulator, and/or a ferromagnet.

[1-1-4] Circuit Structure

FIG. 7 is a circuit diagram showing an example of a configuration and coupling of the read circuit 17 in the magnetic memory device 1 according to the embodiment. FIG. 7 shows a state in which a single memory cell MC is selected as a representative. That is, as described with reference to FIG. 1, the row selection circuit 14 sets a single word line WL to a selected state, and the column selection circuit 15 sets a single bit line BL to a selected state. The single memory cell MC coupled to the single word line WL in the selected state and the single bit line BL in the selected state are set to a selected state. Data is read from or written into the memory cell MC in the selected state. In FIG. 7, the word line WL in the selected state, the bit line BL in the selected state, and the single memory cell MC in the selected state are shown, and the row selection circuit 14 and the column selection circuit 15 are omitted.

As shown in FIG. 7, the read circuit 17 includes a constant voltage circuit 17A, a constant current circuit 17B, and a metal-oxide-semiconductor field-effect transistor (MOSFET) 171.

The constant voltage circuit 17A includes a MOSFET 17A1. One end of the MOSFET 17A1 is coupled to a node VW. The node VW, to which a voltage of a predetermined magnitude VW is applied by, for example, the voltage generator 18, functions as a node that supplies a constant voltage. Hereinafter, the node VW may be referred to as a constant voltage source VW. The other end of the MOSFET 17A1 is coupled to a node N1. A control terminal of the MOSFET 17A1 receives a constant-voltage driver control signal CV17 from the control circuit 13 (not illustrated).

The constant current circuit 17B includes a MOSFET 17B1 and a constant current source 17B2. The constant current source 17B2 is coupled to a node of a power-supply voltage VDD, and supplies a constant current of a certain magnitude. A voltage of a predetermined magnitude VDD is applied to, for example, the node of the power-supply voltage VDD by the voltage generator 18. The constant current is supplied to one end of the MOSFET 17B1. The other end of the MOSFET 17B1 is coupled to the node N1. A control terminal of the MOSFET 17B1 receives a constant-current driver control signal CC17 from the control circuit 13 (not illustrated).

The node N1 is coupled to the bit line BL with the column selection circuit 15 (not illustrated) interposed therebetween. The bit line BL is coupled to the memory cell MC.

The memory cell is coupled to the word line WL. The word line WL is coupled to one end of the MOSFET 171 with the row selection circuit 14 (not illustrated) interposed therebetween. The other end of the MOSFET 171 is coupled to a node of a ground voltage VSS (e.g., 0V). A component of the control circuit 13 (not illustrated) is coupled to a control terminal of the MOSFET 171. The control terminal of the MOSFET 171 receives a control signal SINKEN17 from the control circuit 13.

FIG. 8 is a circuit diagram showing an example of a configuration and coupling of the write circuit 16 in the magnetic memory device 1 according to the embodiment. FIG. 8 shows a single memory cell MC in a selected state, similarly to FIG. 7. As shown in FIG. 8, the write circuit 16 includes a constant voltage circuit 16A, a constant current circuit 16B, a MOSFET 161, a MOSFET 162, and switches TR1 and TR2.

The constant voltage circuit 16A includes a MOSFET 16A1. One end of the MOSFET 16A1 is coupled to a constant voltage source VW. The other end of the MOSFET 16A1 is coupled to a node N2. A control terminal of the MOSFET 16A1 receives a constant-voltage driver control signal CV16 from the control circuit 13 (not illustrated).

The constant current circuit 16B includes a MOSFET 16B1 and a constant current source 16B2. The constant current source 162 is coupled to a node of a power-supply voltage VDD, and supplies a constant current of a certain magnitude. The constant current is supplied to one end of the MOSFET 16B1. The other end of the MOSFET 16B1 is coupled to the node N2. A control terminal of the MOSFET 16B1 receives a constant-current driver control signal CC16 from the control circuit 13 (not illustrated).

The node N2 is coupled to one end of each of the switches TR1 and TR2. The other end of the switch TR1 is coupled to the bit line BL with the column selection circuit 15 (not illustrated) interposed therebetween. The bit line BL is coupled to the memory cell MC. The other end of the switch TR2 is coupled to the word line WL with the row selection circuit 14 (not illustrated) interposed therebetween. A control terminal of the switch TR1 receives a signal IN1 from the control circuit 13. A control terminal of the switch TR2 is applied with a signal IN2.

The bit line BL is also coupled to one end of the MOSFET 161 with the column selection circuit 15 (not illustrated) interposed therebetween. The other end of the MOSFET 161 is coupled to a ground-voltage node VSS. The control terminal of the MOSFET 161 receives a control signal SINKEN161 from the control circuit 13 (not illustrated).

The word line WL is also coupled to one end of the MOSFET 162 with the row selection circuit 14 (not illustrated) interposed therebetween. The other end of the MOSFET 162 is coupled to a ground-voltage node VSS. The control terminal of the MOSFET 162 receives a control signal SINKEN162 from the control circuit 13.

Figure 9:
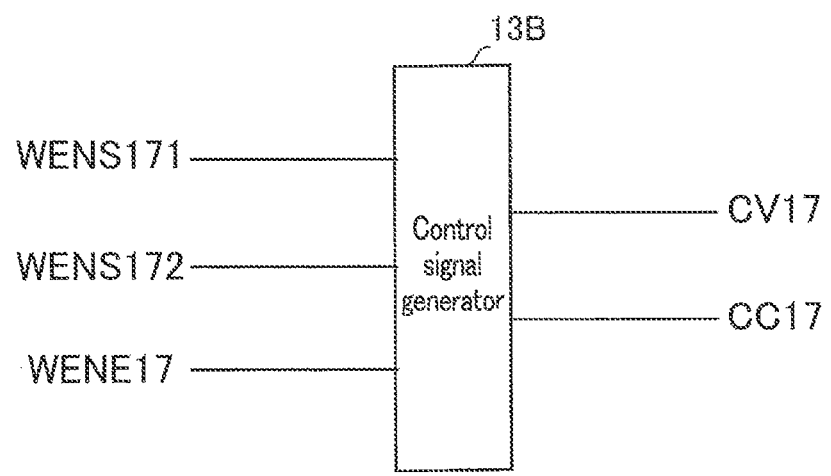
FIG. 9 is a circuit diagram showing an example of a configuration of a control signal generator in the magnetic memory device according to the embodiment.

FIG. 9 is a circuit diagram showing an example of a configuration of the control signal generator 13B in the magnetic memory device 1 according to the embodiment. The control circuit 13 generates, from the received control signal CNT and the command CMD, control signals WENS171, WENS172, and WENE17. The control signal generator 13B receives the control signals WENS171, WENS172, and WENE17. The control signal generator 13B generates, based on the received control signals WENS171, WENS172, and WENE17, a constant-voltage driver control signal CV17 and a constant-current driver control signal CC17. The control signal generator 13B transmits the generated constant-voltage driver control signal CV17 to the constant voltage circuit 17A. The control signal generator 13B transmits the generated constant-current driver control signal CC17 to the constant current circuit 17B.

FIG. 10 is a circuit diagram showing an example of a configuration of the control signal generator 13A in the magnetic memory device 1 according to the embodiment. The control circuit 13 generates, from the received control signal CNT and the command CMD, control signals WENS161, WENS162, and WENE16. The control signal generator 13A receives the control signals WENS161, WENS162, and WENE16. The control signal generator 13A generates, based on the received control signals WENS161, WENS162, and WENE16, a constant-voltage driver control signal CV16 and a constant-current driver control signal CC16. The control signal generator 13A transmits the generated constant-voltage driver control signal CV16 to the constant voltage circuit 16A. The control signal generator 13A transmits the generated constant-current driver control signal CC16 to the constant current circuit 16B.

[1-2] Operation

In an operation to be described below, an example is shown in which a memory cell MCA is targeted. The operation of a memory cell MCB can be easily inferred by applying a description in which the bit line BL and the word line WL are reversely coupled to the description of the operation of the memory cell MCA.

Figure 11:
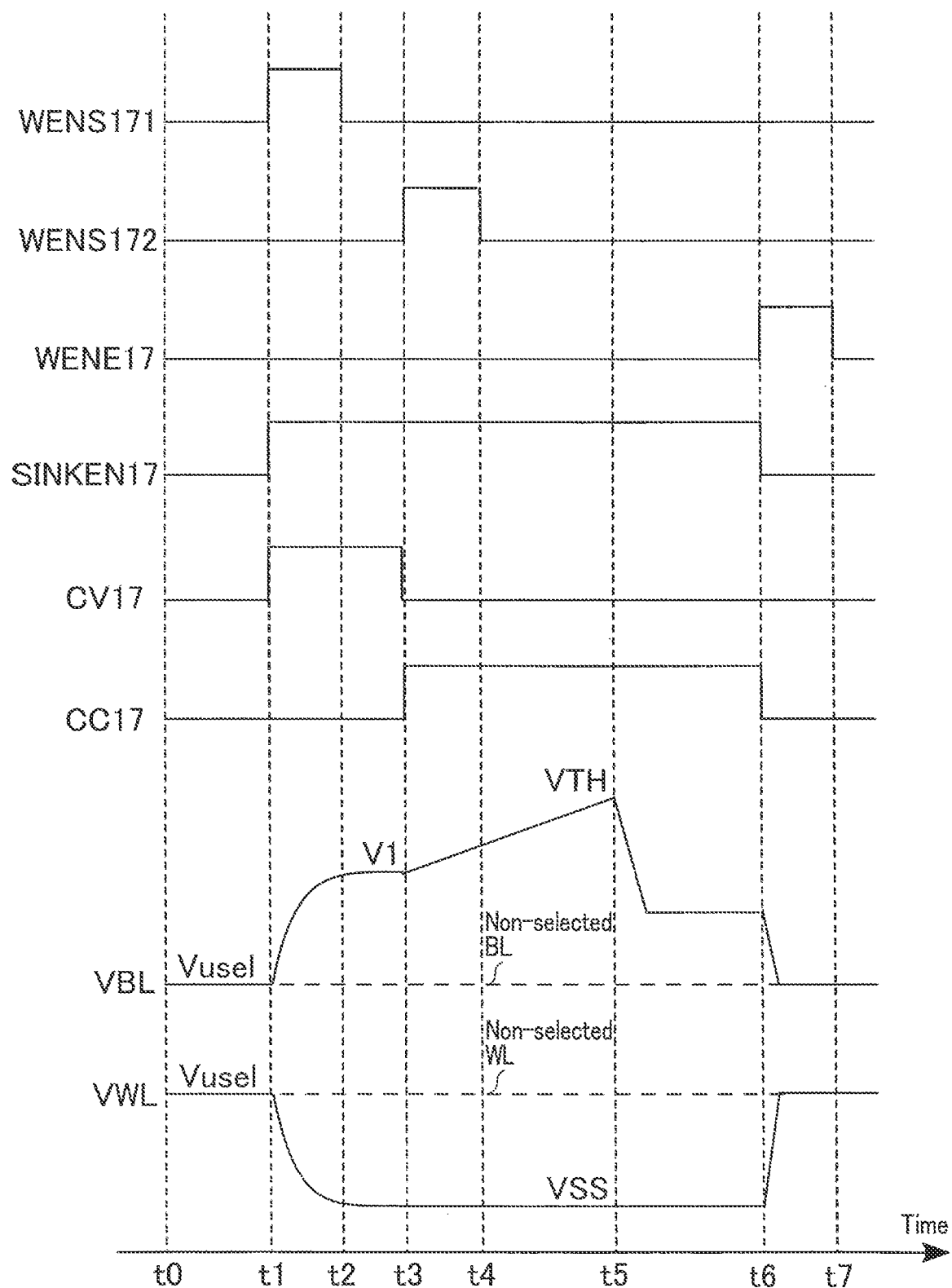
FIG. 11 is a timing chart showing states of signals during data reading of the magnetic memory device according to the embodiment.

FIG. 11 is a timing chart showing, along a timeline, states of some signals during data reading of the magnetic memory device 1 according to the embodiment. FIG. 11 shows a timing chart of the control signals WENS171, WENS172, WENE17, and SINKEN17, a constant-voltage driver control signal CV17, a constant-current driver control signal CC17, a selected bit line voltage VBL, a selected word line voltage VWL, a non-selected bit line voltage VBLusel, and a non-selected word line voltage VWLusel. The selected bit line voltage VBL and the selected word line voltage VWL are a voltage of a bit line BL that has been selected (hereinafter also referred to as a "selected bit line BL") and a voltage of a word line WL that has been selected (hereinafter also referred to as a "selected word line WL"), respectively. The non-selected bit line voltage VBLusel and the non-selected word line voltage VWLusel are a voltage of a bit line BL that has not been selected (hereinafter also referred to as a "non-selected bit line BLusel") and a voltage of a word line WL that has not been selected (hereinafter also referred to as a "non-selected word line WLusel"), respectively. The control signals WENS171, WENS172, and WENE17 are used for generation of a constant-voltage driver control signal CV17 and a constant-current driver control signal CC17. The control signal SINKEN17 is a signal that applies the ground voltage VSS to the selected word line WL to apply a voltage to a memory cell MC.

At time t0, the memory controller 2 starts a read operation. At time t0, the selected bit line voltage VBL and the selected word line voltage VWL are set to a half-selection voltage Vusel. The half-selection voltage Vusel is a voltage that is applied to the non-selected bit line BLusel and the non-selected word line WLusel, and is, for example, a voltage of half the value of the selected voltage Vsel, which is a voltage that is applied to the selected bit line BL and the selected word line WL. The half-selection voltage Vusel is, for example, a voltage of half the value of a threshold voltage (a first threshold voltage or a second threshold voltage) VTH of a selector of a switching element SE of the memory cell MC (hereinafter also referred to as a "selected memory cell MC") coupled to the bit line BL and the word line WL. For example, the non-selected bit line voltage VBLusel and the non-selected word line voltage VWLusel are constantly set to the half-selection voltage Vusel after time t0 until the read operation ends.

At a time prior to time t0 when the read operation starts, for example, the selected bit line voltage VBL, the selected word line voltage VWL, the non-selected bit line voltage VBLusel, and the non-selected word line voltage VWLusel are set to the ground voltage VSS, even though illustration of such a configuration is omitted. At time t0 when the read operation starts, the memory controller 2 sets the selected bit line voltage VBL, the selected word line voltage VWL, the non-selected bit line voltage VBLusel, and the non-selected word line voltage VWLusel to the half-selection voltage Vusel.

Figure 12:
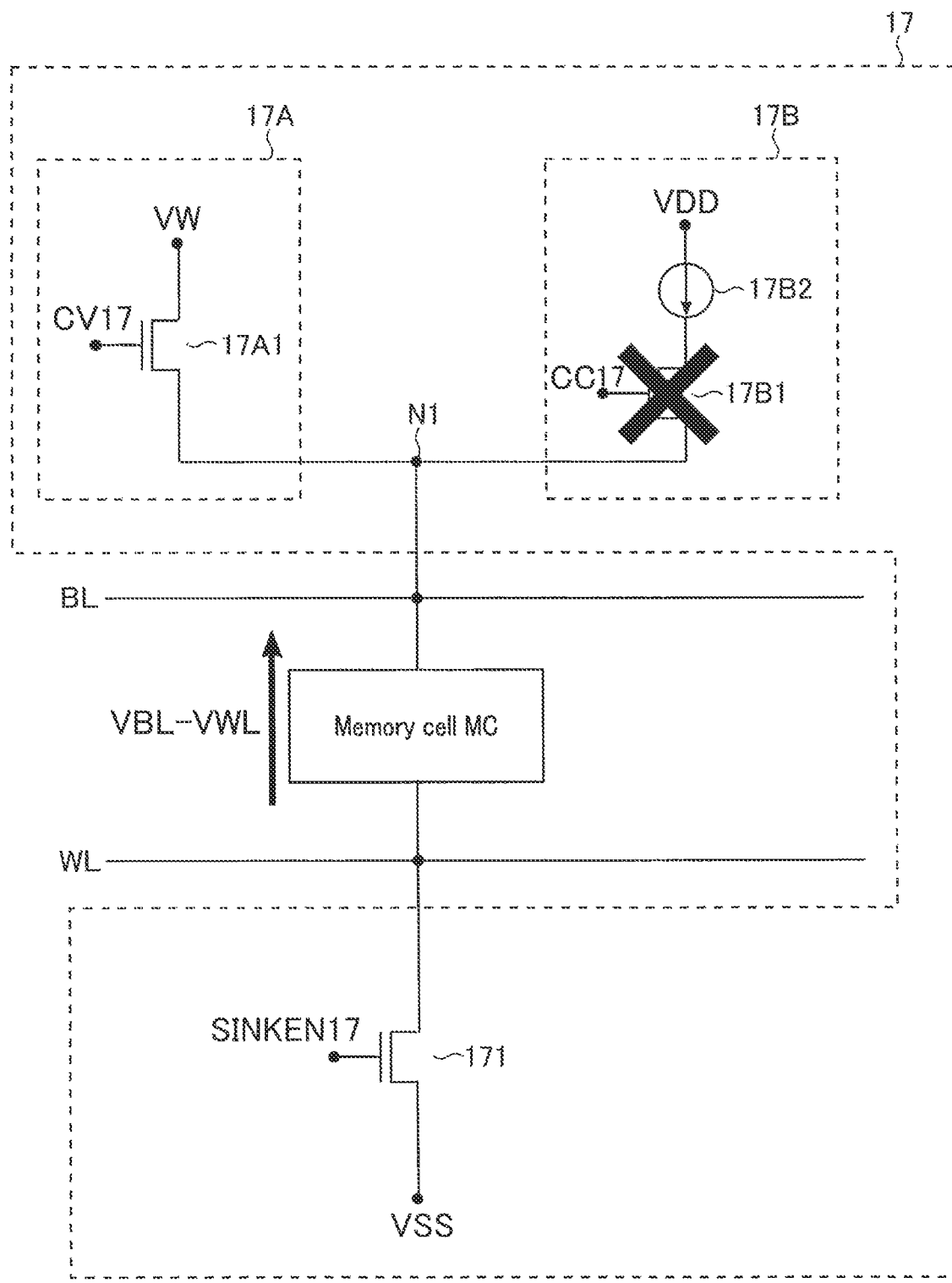
FIG. 12 is a circuit diagram showing an example of a state in which a constant voltage circuit is coupled to the read circuit of the magnetic memory device according to the embodiment.

Over a period from time t1 to time t2 inclusive, the memory controller 2 sets the control signal WENS171 to a high level. With the control signal WENS171 becoming a high level, the control signal generator 13B sets the constant-voltage driver control signal CV17 to a high level. The control signal generator 13B maintains the constant-voltage driver control signal CV17 at a high level regardless of the level of the control signal WENS171 after the control signal WENS171 has become a high level, and maintains the constant-current driver control signal CC17 at a low level from time t1. An example of coupling of the read circuit 17 at this time is shown in FIG. 12. FIG. 12 is a circuit diagram showing an example of a state in which the constant voltage circuit 17A is coupled to the read circuit 17 of the magnetic memory device 1 according to the embodiment. As shown in FIG. 12, from time t1, the selected bit line BL is coupled to the constant voltage circuit 17A, and is not coupled to the constant current circuit 17B. Thus, as illustrated in FIG. 11, the selected bit line BL receives a voltage supply from the constant voltage circuit 17A, causing a rapid rise in the selected bit line voltage VBL.

Also, at time t1, the control circuit 13 sets the control signal SINKEN17 to a high level. With the control signal SINKEN17 becoming a high level, the selected word line WL is coupled to a node of the ground voltage VSS. Accordingly, the value of the selected word line voltage VWL becomes the ground voltage VSS. As shown in FIG. 12, a voltage of a value obtained by (selected bit line voltage VBL—selected word line voltage VWL) is applied to the selected memory cell MC.

As shown in FIG. 11, at time t3, the selected bit line voltage VBL reaches a voltage V1. The voltage V1 is larger than the half-selection voltage Vusel. The voltage V1 is smaller than the threshold voltage VTH of the selector of the switching element SE of the selected memory cell MC coupled to the selected bit line BL and the selected word line WL. A description of details of the voltage V1 will be given later.

Over a period from time t3 to time t4 inclusive, the memory controller 2 sets the control signal WENS172 to a high level. With the control signal WENS172 becoming a high level, the control signal generator 13B sets the constant-voltage driver control signal CV17 to a low level. The control signal generator 13B maintains the constant-voltage driver control signal CV17 at a low level regardless of the level of the control signal WENS172, after the control signal WENS172 has become a high level. With the control signal WENS172 becoming a high level, the control signal generator 13B sets the constant-current driver control signal CC17 to a high level. The control signal generator 13B maintains the constant-current driver control signal CC17 at a high level regardless of the level of the control signal WENS172, after the control signal WENS172 has become a high level.

Figure 13:
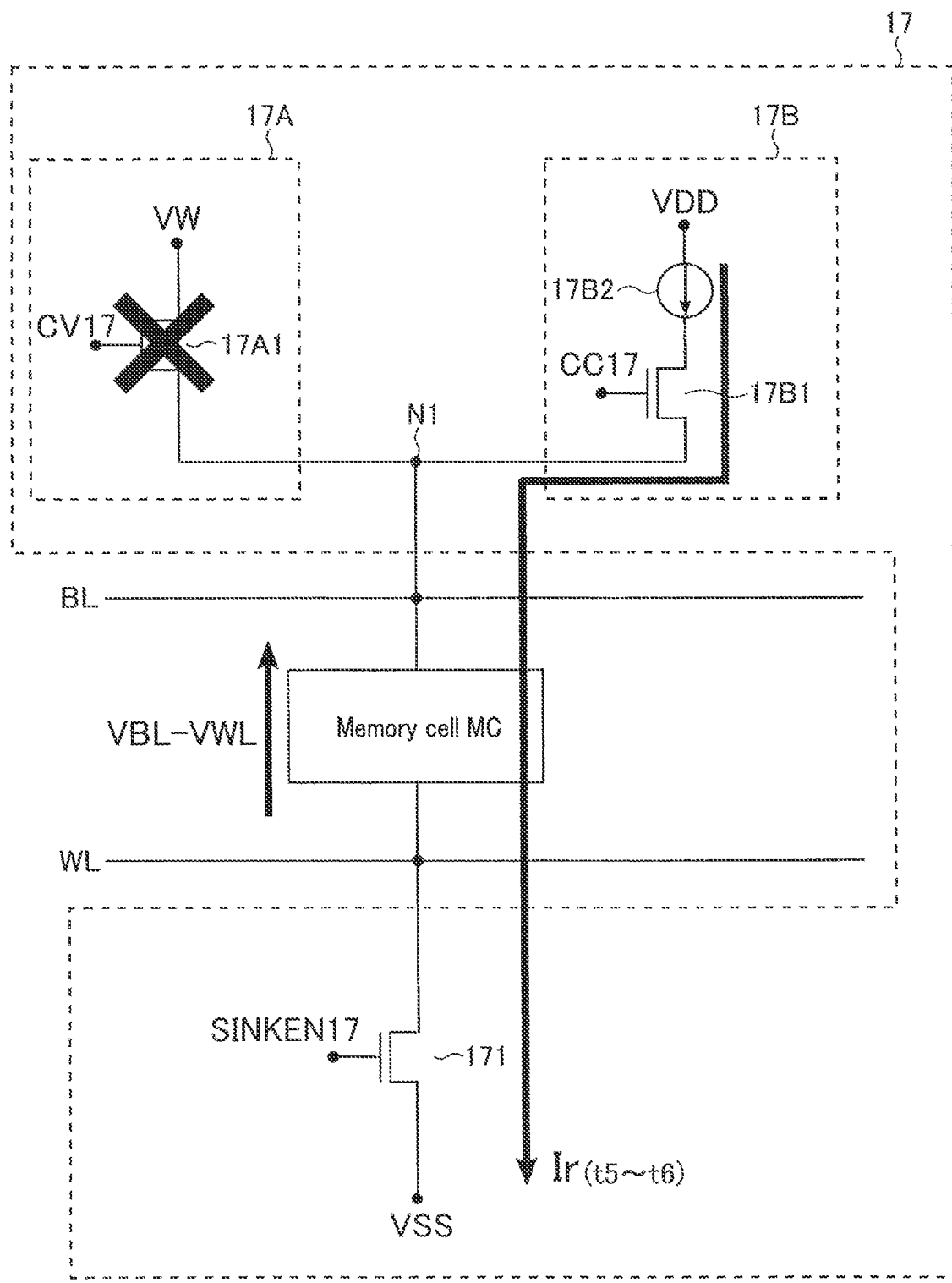
FIG. 13 is a circuit diagram showing an example of a state in which a constant current circuit is coupled to the read circuit of the magnetic memory device according to the embodiment.

An example of coupling of the read circuit 17 at this time is shown in FIG. 13. FIG. 13 is a circuit diagram showing an example of a state in which the constant current circuit 17B is coupled to the read circuit 17 of the magnetic memory device 1 according to the embodiment. As shown in FIG. 13, from time t3, the selected bit line BL is decoupled from the constant voltage circuit 17A, and is coupled to the constant current circuit 17B. Thus, the selected bit line BL is supplied with a constant current from the constant current circuit 17B.

Thereby, as illustrated in FIG. 11, at time t3, the selected bit line voltage VBL changes from a rapidly enlarging movement to a movement of increasing by a predetermined magnitude per unit time.

At time t5, the selected bit line voltage VBL reaches the threshold voltage VTH. Thereby, a voltage obtained by voltage (VTH−VSS) (=VTH) is applied to the switching element SE. As a result, the switching element SE is turned on. Accordingly, a read current Ir flows between the selected bit line BL and the selected word line WL. The read current Ir flows from the node VDD toward the node VSS. With the flow of the read current Ir, the selected bit line voltage VBL decreases. The selected bit line voltage VBL falls to a voltage of a magnitude that is based on the resistance state of the selected memory cell MC.

Over a period from time t6 to time t7 inclusive, the memory controller 2 sets the control signal WENE17 to a high level. With the control signal WEN17 becoming a high level, the control signal generator 13B sets the constant-current driver control signal CC17 to a low level, and maintains the constant-current driver control signal CC17 at a low level thereafter. Accordingly, from time t6, the selected bit line BL is decoupled from the constant current circuit 17B. Thus, the selected bit line voltage VBL reverts to the half-selection voltage Vusel. Also, at time t6, the control circuit 13 sets the control signal SINKEN17 to a low level. With the control signal SINKEN17 being set to a low level, the value of the selected word line voltage VWL reverts to the half-selection voltage Vusel.

At a time later than time t7 when the read operation ends, for example, the selected bit line voltage VBL, the selected word line voltage VWL, the non-selected bit line voltage VBLusel, and the non-selected word line voltage VWLusel revert to the ground voltage VSS, even though illustration of such a configuration is omitted. At a time later than time t7 when the read operation ends, the memory controller 2 sets the selected bit line voltage VBL, the selected word line voltage VWL, the non-selected bit line voltage VBLusel, and the non-selected word line voltage VWLusel to the half-selection voltage Vusel.

Over a period from time t5 to time t6 inclusive, a data determination operation is performed on the selected memory cell MC. A data determination operation is an operation of performing determination as to whether the resistance of the MTJ element MTJ of the selected memory cell MC is in a low-resistance state or a high-resistance state. The read current Ir flows over the period from time t5 to time t6 inclusive. Over a period from time t1 to time t3 inclusive, the read circuit 17 of the magnetic memory device 1 according to the embodiment is in the state of coupling illustrated in FIG. 12. Over a period from time t3 to time t6 inclusive, the read circuit 17 of the magnetic memory device 1 according to the embodiment is in the state of coupling illustrated in FIG. 13.

Figure 14:
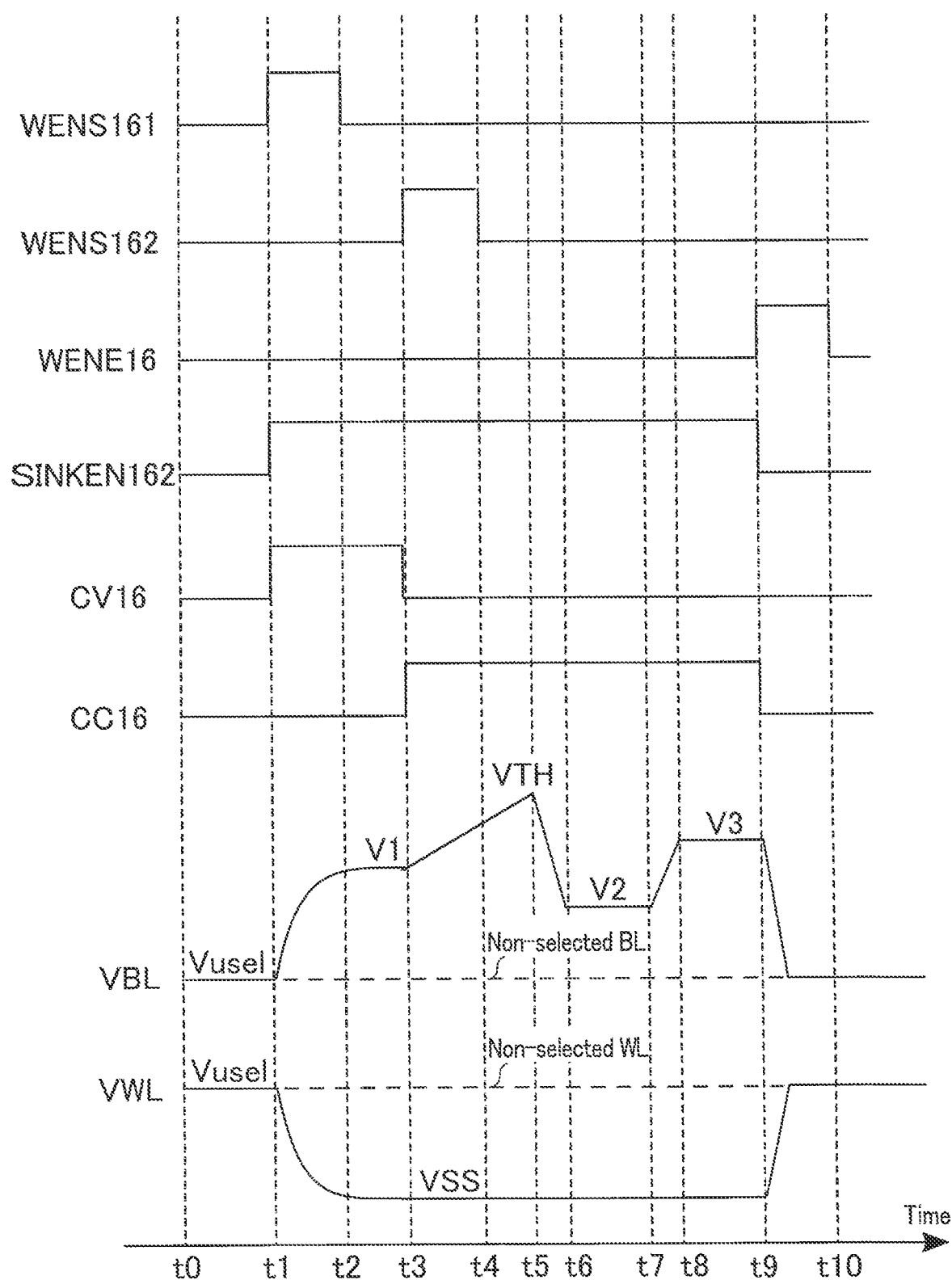
FIG. 14 is a timing chart showing states of signals during data writing when a selected MTJ element of a magnetic memory device according to the embodiment is in a low-resistance state.

FIG. 14 is a timing chart showing, along a timeline, states of some signals during data writing when the resistance of an MTJ element MTJ (hereinafter also referred to as a "selected MTJ element") of a selected memory cell MC of the magnetic memory device 1 according to the embodiment is in a low-resistance state. FIG. 14 illustrates signals in the case of writing (AP writing) to turn the resistance of a selected MTJ element MTJ to a high-resistance state when its initial state is a low-resistance state. FIG. 14 shows a timing chart of control signals WENS161, WENS162, WENE16, and SINKEN162, a constant-voltage driver control signal CV16, a constant-current driver control signal CC16, a selected bit line voltage VBL, a selected word line voltage VWL, a non-selected bit line voltage VBLusel, and a non-selected word line voltage VWLusel. The control signals WENS161, WENS162, and WENE16 are used for generation of a constant-voltage driver control signal CV16 and a constant-current driver control signal CC16. The control signal SINKEN162 is a signal that applies the ground voltage VSS to the selected word line WL to apply a voltage to the memory cell MC. During the operation of FIG. 14, under the control of the control circuit 13, the signal IN1 is maintained at a high level, and the signal IN2 and the control signal SINKEN162 are maintained at a low level. Thus, the node N2 is coupled to the selected bit line BL and is not coupled to the selected word line WL, and the selected bit line BL is not coupled to the node of the ground voltage VSS.

At time t0, the memory controller 2 starts a write operation. At time t0, the selected bit line voltage VBL and the selected word line voltage VWL are set to a half-selection voltage Vusel. For example, the non-selected bit line voltage VBLusel and the non-selected word line voltage VWLusel are constantly set to the half-selection voltage Vusel after time t0 until the write operation ends.

At a time prior to time t0 when the write operation starts, for example, the selected bit line voltage VBL, the selected word line voltage VWL, the non-selected bit line voltage VBLusel, and the non-selected word line voltage VWLusel are set to the ground voltage VSS, even though illustration of such a configuration is omitted. At time t0 when the write operation starts, the memory controller 2 sets the selected bit line voltage VBL, the selected word line voltage VWL, the non-selected bit line voltage VBLusel, and the non-selected word line voltage VWLusel to the half-selection voltage Vusel.

Figure 15:
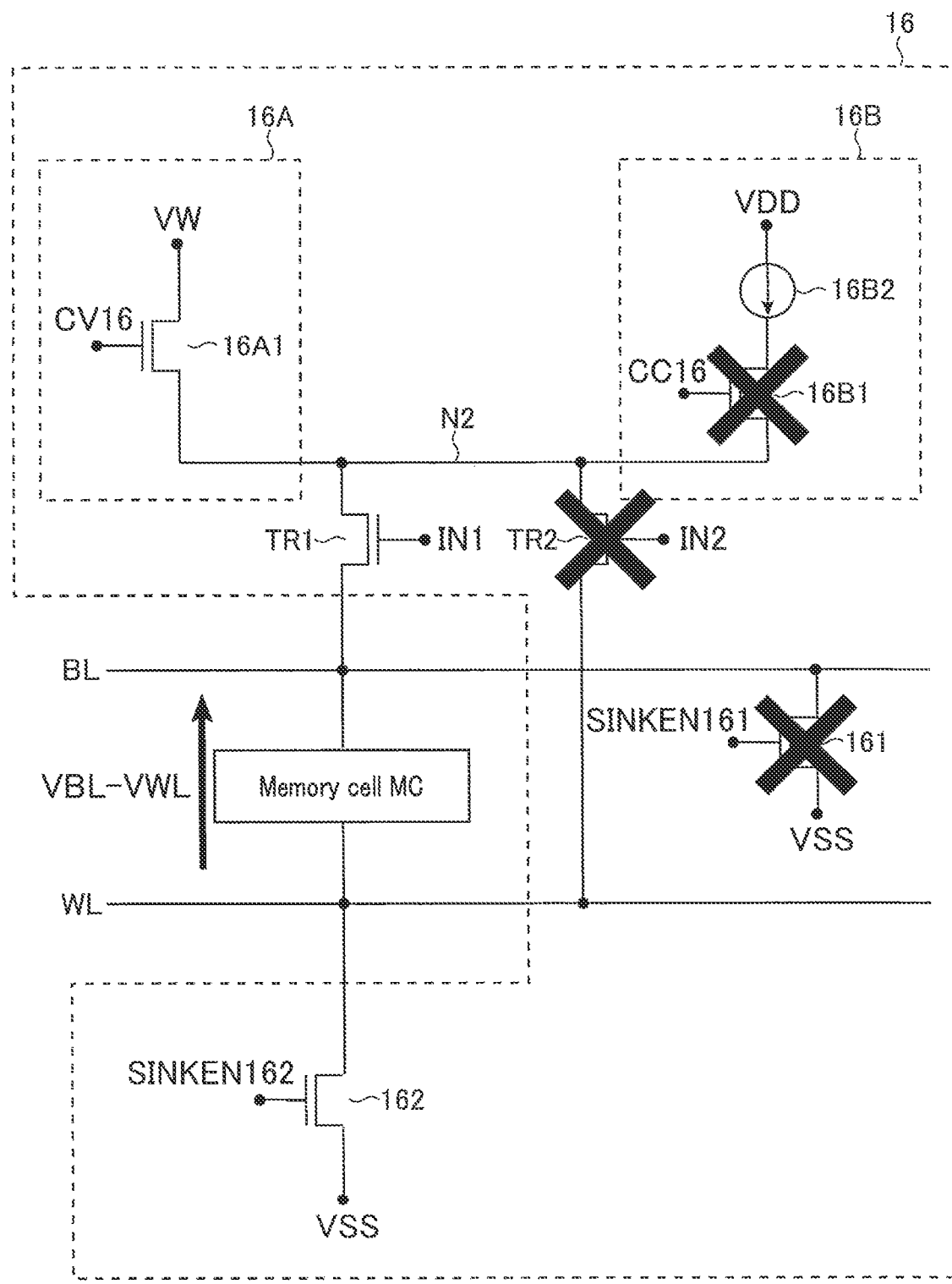
FIG. 15 is a circuit diagram showing an example of a state in which a constant voltage circuit is coupled to a write circuit of the magnetic memory device according to the embodiment.

Over a period from time t1 to time t2 inclusive, the memory controller 2 sets the control signal WENS161 to a high level. With the control signal WENS161 becoming a high level, the control signal generator 13B sets the constant-voltage driver control signal CV16 to a high level. The control signal generator 13B maintains the constant-voltage driver control signal CV16 at a high level regardless of the level of the control signal WENS161 after the control signal WENS161 has become a high level, and maintains the constant-current driver control signal CC16 at a low level from time t1. An example of coupling of the write circuit 16 at this time is shown in FIG. 15. FIG. 15 is a circuit diagram showing an example of a state in which the constant voltage circuit 16A is coupled to the write circuit 16 of the magnetic memory device 1 according to the embodiment. As shown in FIG. 15, from time t1, the selected bit line BL is coupled to the constant voltage circuit 16A, and is not coupled to the constant current circuit 16B. Thus, as illustrated in FIG. 14, the selected bit line BL receives a voltage supply from the constant voltage circuit 16A, causing a rapid rise in the selected bit line voltage VBL.

Also, at time t1, the control circuit 13 sets the control signal SINKEN162 to a high level. With the control signal SINKEN162 becoming a high level, the selected word line WL is coupled to a node of the ground voltage VSS. Accordingly, the value of the selected word line voltage VWL becomes the ground voltage VSS. As shown in FIG. 15, a voltage of a value obtained by (selected bit line voltage VBL—selected word line voltage VWL) is applied to the memory cell MC.

As shown in FIG. 14, at time t3, the selected bit line voltage VBL reaches a voltage V1. The voltage V1 is larger than the half-selection voltage Vusel and smaller than the threshold voltage VTH. The voltage V1 may be of a value identical to or different from the value of the voltage V1 in a read operation. A description of details of the voltage V1 will be given later.

Over a period from time t3 to time t4 inclusive, the memory controller 2 sets the control signal WENS162 to a high level. With the control signal WENS162 becoming a high level, the control signal generator 13B sets the constant-voltage driver control signal CV16 to a low level. The control signal generator 13B maintains the constant-voltage driver control signal CV16 at a low level regardless of the level of the control signal WENS162, after the control signal WENS162 has become a high level. With the control signal WENS162 becoming a high level, the control signal generator 138 sets the constant-current driver control signal CC16 to a high level. The control signal generator 13B maintains the constant-current driver control signal CC16 at a high level regardless of the level of the control signal WENS162, after the control signal WENS162 has become a high level.

Figure 16:
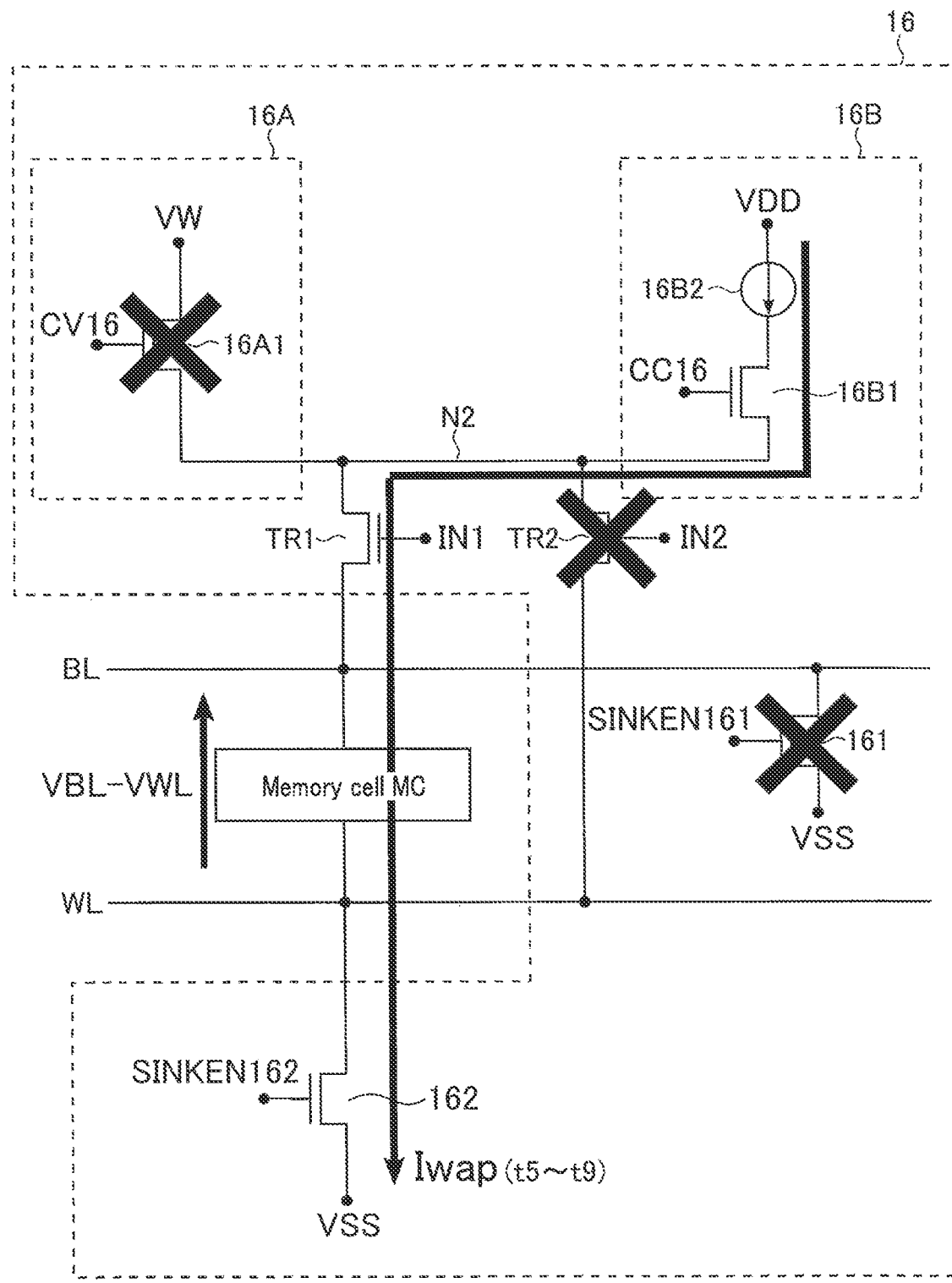
FIG. 16 is a circuit diagram showing an example of a state in which the constant current circuit is coupled to the write circuit of the magnetic memory device according to the embodiment.

An example of coupling of the write circuit 16 at this time is shown in FIG. 16. FIG. 16 is a circuit diagram showing an example of a state in which the constant current circuit 16B is coupled to the write circuit 16 of the magnetic memory device 1 according to the embodiment. As shown in FIG. 16, from time t3, the selected bit line BL is decoupled from the constant voltage circuit 16A, and is coupled to the constant current circuit 16B. Thus, the selected bit line BL is supplied with a constant current from the constant current circuit 16B.

Thereby, as illustrated in FIG. 14, at time t3, the selected bit line voltage VBL changes from a rapidly enlarging movement to a movement of increasing by a predetermined magnitude per unit time.

At time t5, the selected bit line voltage VBL reaches the threshold voltage VTH. Thereby, a voltage obtained by voltage (VTH−VSS) (=VTH) is applied to the switching element SE. As a result, the switching element SE is turned on. Accordingly, the AP write current Iwap flows between the selected bit line BL and the selected word line WL. The AP write current Iwap flows from the node VDD toward the node VSS via the switch TR1 and the MOSFET 162. With the flow of the AP write current Iwap, the selected bit line voltage VBL, decreases. The selected bit line voltage VBL falls to a voltage of a magnitude that is based on the resistance state of the selected MTJ element MTJ. Since the initial state of the selected memory cell MC is a low-resistance state, at time t5, the selected bit line voltage VBL falls to a voltage V2 (hereinafter also referred to as a "low-resistance state voltage V2"), which is a voltage the resistance of the selected MTJ element MTJ takes in a low-resistance state.

Over a period from time t7 to time t8 inclusive, the resistance of the selected MTJ element MTJ is switched from a low-resistance state to a high-resistance state. Thereby, the selected bit line voltage VBL increases from the low-resistance state voltage V2 to a voltage V3 (hereinafter also referred to as a "high-resistance state voltage V3"), which is a voltage the resistance of the selected MTJ element MTJ takes in a high-resistance state.

Over a period from time t9 to time t10 inclusive, the memory controller 2 sets the control signal WENE16 to a high level. With the control signal WENE16 becoming a high level, the control signal generator 13B sets the constant-current driver control signal CC16 to a low level, and maintains the constant-current driver control signal CC16 at a low level thereafter. Accordingly, from time t9, the selected bit line BL is decoupled from the constant current circuit 16B. Thus, the selected bit line voltage VBL reverts to the half-selection voltage Vusel. Also, at time t9, the control circuit 13 sets the control signal SINKEN162 to a low level. With the control signal SINKEN162 being set to a low level, the value of the selected word line voltage VWL reverts to the half-selection voltage Vusel.

At a time later than time t10 when the write operation ends, for example, the selected bit line voltage VBL, the selected word line voltage VWL, the non-selected bit line voltage VBLusel, and the non-selected word line voltage VWLusel revert to the ground voltage VSS, even though illustration of such a configuration is omitted. At a time later than time t10 when the write operation ends, the memory controller 2 sets the selected bit line voltage VBL, the selected word line voltage VWL, the non-selected bit line voltage VBLusel, and the non-selected word line voltage VWLusel to the half-selection voltage Vusel.

Over a period from time t5 to time t9 inclusive, a data setting operation is performed on the selected memory cell MC. The data setting operation is an operation of setting the MTJ element MTJ of the selected memory cell MC to a resistance state based on write data. The AP write current Iwap flows over a period from time t5 to time t9 inclusive. Over a period from time t1 to time t3 inclusive, the write circuit 16 of the magnetic memory device 1 according to the embodiment is in the state of coupling illustrated in FIG. 15. Over a period from time t3 to time t9 inclusive, the write circuit 16 of the magnetic memory device 1 according to the embodiment is in the state of coupling illustrated in FIG. 16.

Figure 17:
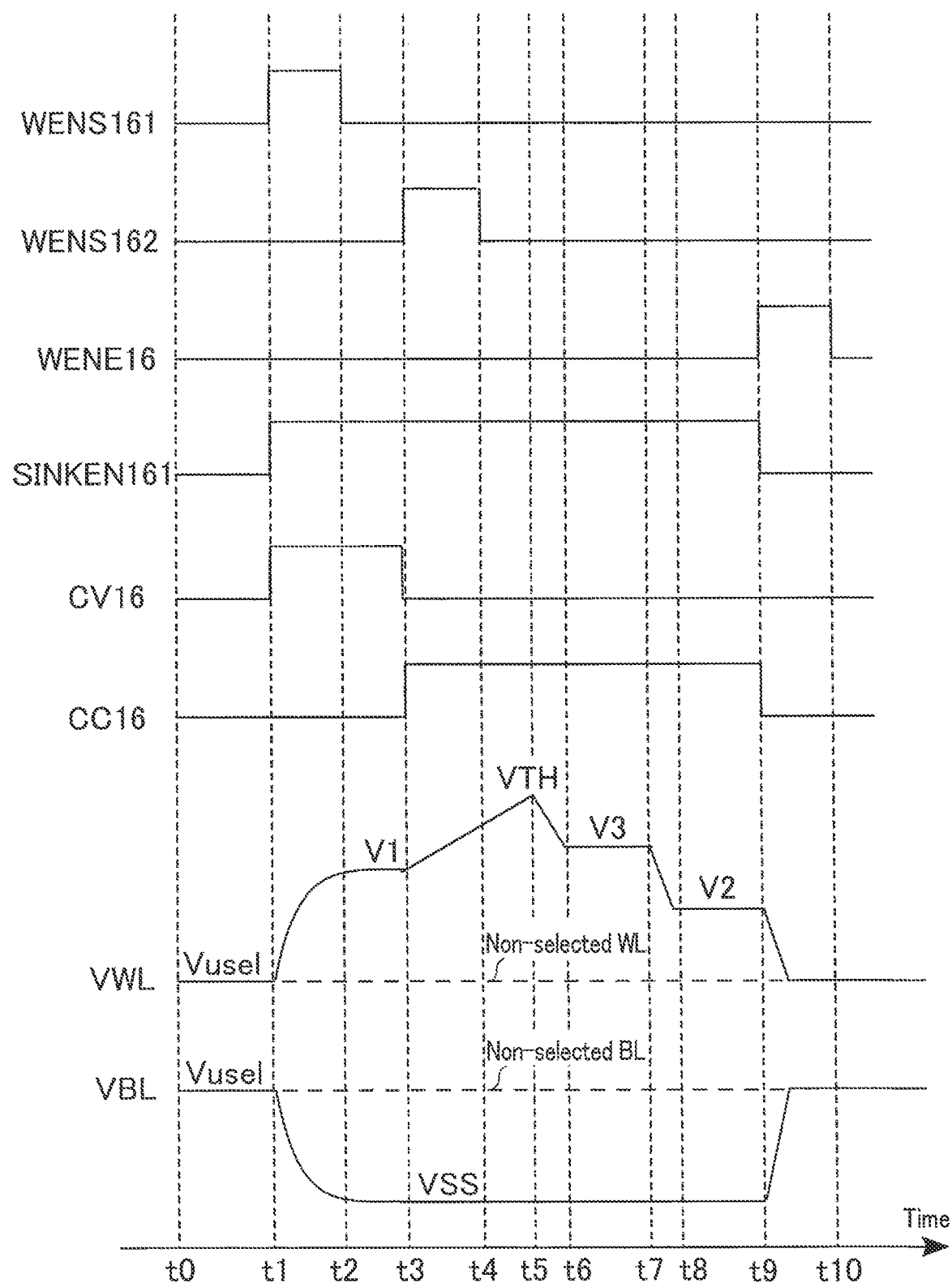
FIG. 17 is a timing chart showing states of signals during data writing when a selected MTJ element of a magnetic memory device according to the embodiment is in a high-resistance state.

FIG. 17 is a timing chart showing, along a timeline, states of some signals during data writing when a selected MTJ element of the magnetic memory device 1 according to the embodiment is in a high-resistance state. FIG. 17 illustrates signals in the case of writing (P writing) to turn the resistance of a selected MTJ element MTJ to a low-resistance state when its initial state is a high-resistance state. FIG. 17 shows a timing chart of control signals WENS161, WENS162, WENE16, and SINKEN161, a constant-voltage driver control signal CV16, a constant-current driver control signal CC16, a selected bit line voltage VBL, a selected word line voltage VWL, a non-selected bit line voltage VBLusel, and a non-selected word line voltage VWLusel. The control signals WENS161, WENS162, and WENE16 are used for generation of a constant-voltage driver control signal CV16 and a constant-current driver control signal CC16. The control signal SINKEN161 is a signal that applies the ground voltage VSS to the selected word line WL to apply a voltage to the memory cell MC. During the operation of FIG. 17, under the control of the control circuit 13, the signal IN2 is maintained at a high level, and the signal IN1 and the control signal SINKEN162 are maintained at a low level. Thus, the node N2 is coupled to the selected word line WL and is not coupled to the selected bit line BL, and the selected word line WL is not coupled to the node of the ground voltage VSS.

At time t0, the memory controller 2 starts a write operation. At time t0, the selected bit line voltage VBL and the selected word line voltage VWL are set to a half-selection voltage Vusel. For example, the non-selected bit line voltage VBLusel and the non-selected word line voltage VWLusel are constantly set to the half-selection voltage Vusel after time t0 until the write operation ends.

At a time prior to time t0 when the write operation starts, for example, the selected bit line voltage VBL, the selected word line voltage VWL, the non-selected bit line voltage VBLusel, and the non-selected word line voltage VWLusel are set to the ground voltage VSS, even though illustration of such a configuration is omitted. At time t0 when the write operation starts, the memory controller 2 sets the selected hit line voltage VBL, the selected word line voltage VWL, the non-selected bit line voltage VBLusel, and the non-selected word line voltage VWLusel to the half-selection voltage Vusel.

Figure 18:
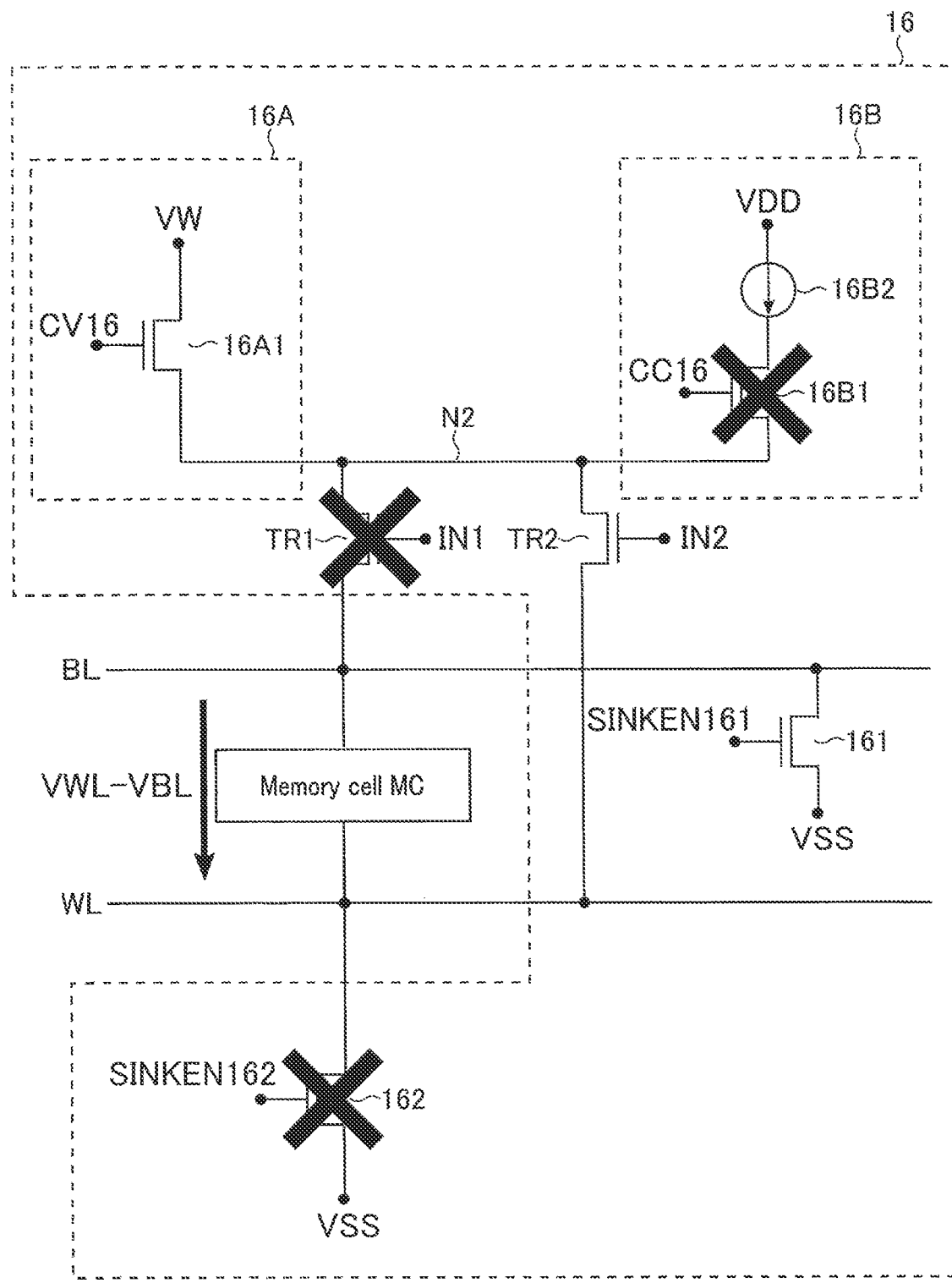
FIG. 18 is a circuit diagram showing an example of a state in which a constant voltage circuit is coupled to a write circuit of the magnetic memory device according to the embodiment.

Over a period from time t1 to time t2 inclusive, the memory controller 2 sets the control signal WENS161 to a high level. With the control signal WENS161 becoming a high level, the control signal generator 13B sets the constant-voltage driver control signal CV16 to a high level. The control signal generator 13B maintains the constant-voltage driver control signal CV16 at a high level regardless of the level of the control signal WENS161 after the control signal WENS161 has become a high level, and maintains the constant-current driver control signal CC16 at a low level from time U. An example of coupling of the write circuit 16 at this time is shown in FIG. 18. FIG. 18 is a circuit diagram showing an example of a state in which the constant voltage circuit 16A is coupled to the write circuit 16 of the magnetic memory device 1 according to the embodiment. As shown in FIG. 18, from time t1, the selected word line WL is coupled to the constant voltage circuit 16A, and is not coupled to the constant current circuit 16B. Thus, as illustrated in FIG. 17, the selected word line WL receives a voltage supply from the constant voltage circuit 16A, causing a rapid rise in the selected word line voltage VWL.

Also, at time t1, the control circuit 13 sets the control signal. SINKEN161 to a high level. With the control signal SINKEN161 becoming a high level, the selected bit line BL is coupled to a node of the ground voltage VSS. Accordingly, the value of the selected bit line voltage VBL becomes the ground voltage VSS. As shown in FIG. 18, a voltage of a value obtained by (selected word line voltage VWL— selected bit line voltage VBL) is applied to the memory cell MC.

As shown in FIG. 17, at time t3, the voltage VWL of the selected word line WL reaches a voltage V1. The voltage V1 is larger than the half-selection voltage Vusel and smaller than the threshold voltage VTH. The voltage V1 may be of a value identical to or different from the value of the voltage V1 in the read operation. A description of details of the voltage V1 will be given later.

Over a period from time t3 to time t4 inclusive, the memory controller 2 sets the control signal WENS162 to a high level. With the control signal WENS162 becoming a high level, the control signal generator 13B sets the constant-voltage driver control signal CV16 to a low level. The control signal generator 13B maintains the constant-voltage driver control signal CV16 at a low level regardless of the level of the control signal WENS162, after the control signal WENS162 has become a high level. With the control signal WENS162 becoming a high level, the control signal generator 13B sets the constant-current driver control signal CC16 to a high level. The control signal generator 138 maintains the constant-current driver control signal CC16 at a high level regardless of the level of the control signal WENS162, after the control signal WENS162 has become a high level.

Figure 19:
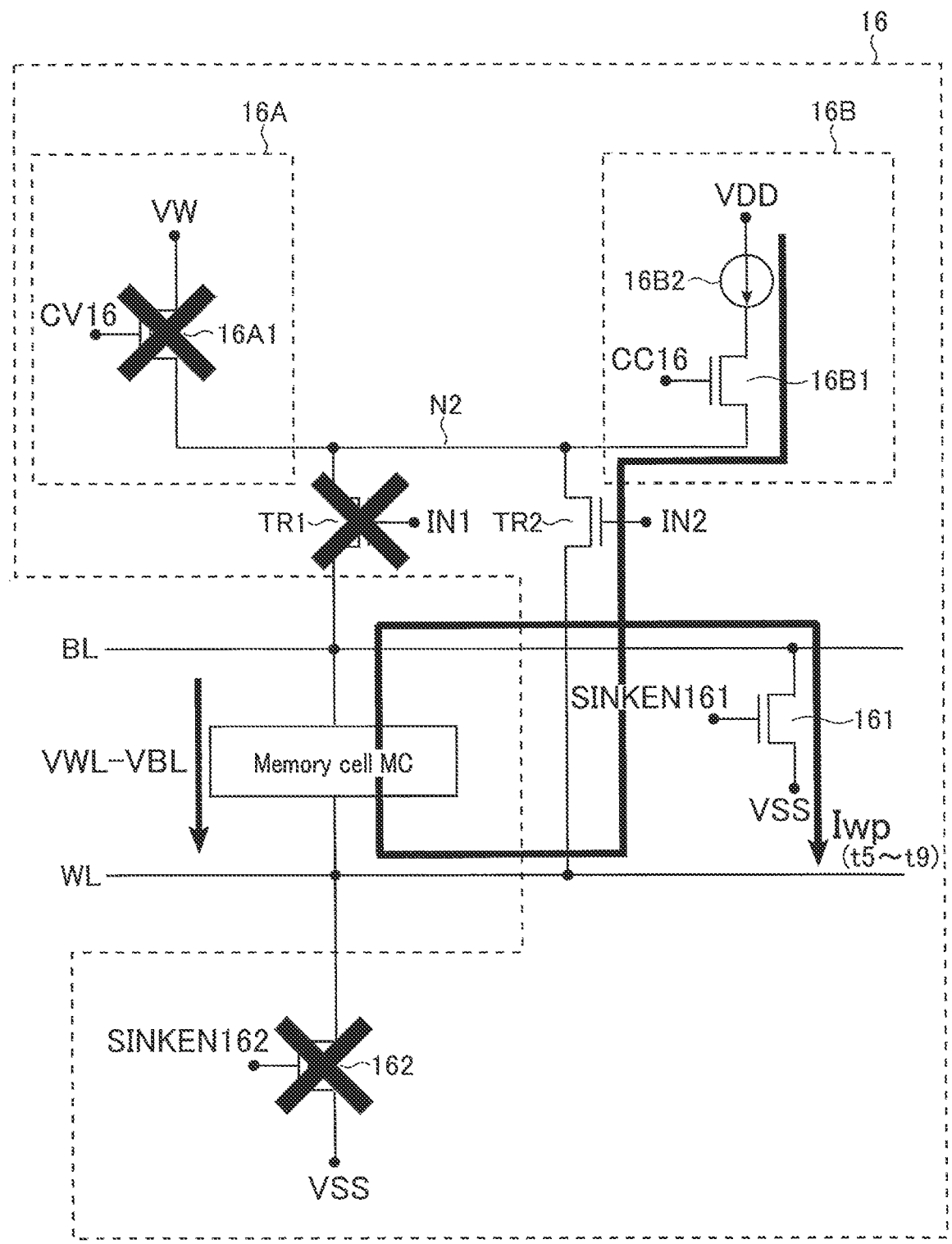
FIG. 19 is a circuit diagram showing an example of a state in which the constant current circuit is coupled to the write circuit of the magnetic memory device according to the embodiment.

An example of coupling of the write circuit 16 at this time is shown in FIG. 19. FIG. 19 is a circuit diagram showing an example of a state in which the constant current circuit 16B is coupled to the write circuit 16 of the magnetic memory device 1 according to the embodiment. As shown in FIG. 19, from time t3, the selected word line WL is decoupled from the constant voltage circuit 16A, and is coupled to the constant current circuit 16B. Thus, the selected word line WL is supplied with a constant current from the constant current circuit 16B.

Thereby, as illustrated in FIG. 17, at time t3, the selected word line voltage VWL changes from a rapidly enlarging movement to a movement of increasing by a predetermined magnitude per unit time.

At time t5, the selected word line voltage VWL reaches a threshold voltage VTH. Thereby, a voltage obtained by voltage (VTH−VSS) (=VTH) is applied to the switching element SE. As a result, the switching element SE is turned on. Accordingly, the P write current Iwp flows between the selected word line WL and the selected bit line BL. The P write current Iwp flows from the node VDD toward the node VSS via the switch TR2 and the MOSFET 161. With the flow of the P write current Iwp, the selected word line voltage VWL decreases. The selected word line voltage VWL falls to a voltage of a magnitude that is based on the resistance state of the selected MTJ element MTJ. Since the initial state of the selected memory cell MC is a high-resistance state, at time t5, the selected word line voltage VWL of the selected MTJ element MTJ falls to the high-resistance state voltage V3.

Over a period from time t7 to time t8 inclusive, the resistance of the selected MTJ element MTJ is switched from a high-resistance state to a low-resistance state. Thereby, the selected word line voltage VWL falls from a high-resistance state voltage V3 to a low-resistance state voltage V2.

Over a period from time t9 to time t10 inclusive, the memory controller 2 sets the control signal WENE16 to a high level. With the control signal WENE16 becoming a high level, the control signal generator 13B sets the constant-current driver control signal CC16 to a low level, and maintains the constant-current driver control signal CC16 at a low level thereafter. Accordingly, from time t9, the selected word line WL is decoupled from the constant current circuit 16B. Thus, the selected word line voltage VWL reverts to the half-selection voltage Vusel. Also, at time t9, the control circuit 13 sets the control signal SINKEN161 to a low level. With the control signal SINKEN161 being set to a low level, the value of the selected bit line voltage VBL reverts to the half-selection voltage Vusel.

At a time later than time t10 when the write operation ends, for example, the selected bit line voltage VBL, the selected word line voltage VWL, the non-selected bit line voltage VBLusel, and the non-selected word line voltage VWLusel revert to the ground voltage VSS, even though illustration of such a configuration is omitted. At a time later than time t10 when the write operation ends, the memory controller 2 sets the selected bit line voltage VBL, the selected word line voltage VWL, the non-selected bit line voltage VBLusel, and the non-selected word line voltage VWLusel to the half-selection voltage Vusel.

Over a period from time t5 to time t9 inclusive, a data setting operation is performed on the selected memory cell MC. The data setting operation is an operation of setting the MTJ element MTJ of the selected memory cell MC to a resistance state based on write data. The P write current Iwp flows over a period from time t5 to time t9 inclusive. Over a period from time t1 to time t3 inclusive, the write circuit 16 of the magnetic memory device 1 according to the embodiment is in the state of coupling illustrated in FIG. 18. Over a period from time t3 to time t9 inclusive, the write circuit 16 of the magnetic memory device 1 according to the embodiment is in the state of coupling illustrated in FIG. 19.

[1-3] Advantageous Effects of Embodiment

With the magnetic memory device 1 according to the embodiment described above, it is possible to shorten the time taken to start writing and reading, thus providing a magnetic memory device with a fast response speed. Hereinafter, a description will be given of detailed effects of the magnetic memory device 1 according to the embodiment.

Figure 20:
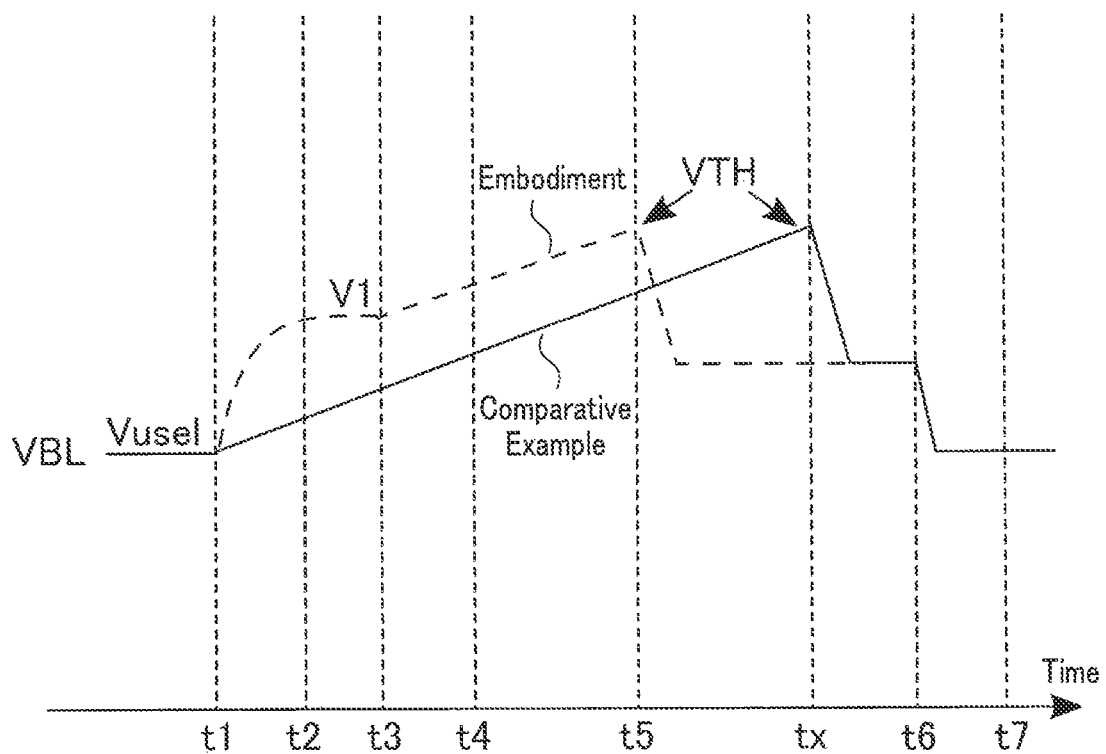
FIG. 20 is a conceptual diagram showing a state of a selected bit line voltage VBL during data reading of a magnetic memory device according to a comparative example of the embodiment.

FIG. 20 is a conceptual diagram showing a state of a selected bit line voltage VBL during data reading of a magnetic memory device 111 according to a comparative example of the embodiment. For comparison, FIG. 20 also shows a state of the selected bit line voltage VBL during data reading of the magnetic memory device 1 according to the embodiment shown in FIG. 11.

A read circuit of the magnetic memory device 111 includes, for example, a constant current circuit, and does not include a constant voltage circuit. That is, the magnetic memory device 111 differs from the magnetic memory device 1 according to the embodiment mainly in that neither the read circuit nor a write circuit includes a constant voltage circuit.

Since the magnetic memory device 111 does not include a constant voltage circuit, the value of the selected bit line voltage VBL is increased by the constant current circuit, as shown in FIG. 20. Specifically, the selected bit line BL of the magnetic memory device 111 is, at time t1, coupled to the constant current circuit, and is supplied with a constant current. Thereby, from time t1, the selected bit line voltage VBL of the magnetic memory device 111 increases by a predetermined magnitude per unit time.

At time tx, the selected bit line voltage VBL of the magnetic memory device 111 reaches the threshold voltage VTH. Thereby, a voltage obtained by voltage (VTH−VSS) (=VTH) is applied to the switching element SE. As a result, the switching element SE is turned on. Accordingly, a current flows between the selected bit line BL and the selected word line WL, and the selected bit line voltage VBL decreases. The selected bit line voltage VBL falls to a voltage of a magnitude that is based on the resistance state of the selected memory cell MC. Behaviors at times later than time tx are similar to those of the magnetic memory device 1 according to the embodiment, and a description thereof will be omitted.

In this manner, the selected bit line voltage VBL of the magnetic memory device 111 increases by a predetermined magnitude per unit time from the half-selection voltage Vusel to the threshold voltage VTH. Thus, the time when the selected bit line voltage VBL of the magnetic memory device 111 reaches the threshold voltage VTH is time tx later than time t5. The time t5 is a time when the selected bit line voltage VBL of the magnetic memory device 1 according to the embodiment reaches the threshold voltage VTH. That is, the selected bit line voltage VBL of the magnetic memory device 111 may take a longer time to reach the threshold voltage VTH than the selected bit line voltage VBL of the magnetic memory device 1. That is, the magnetic memory device 111 may take a longer time to start reading than the magnetic memory device 1.

The magnetic memory device 1 according to the embodiment includes, in the read circuit 17, the constant current circuit 17B and the constant voltage circuit 17A. The constant voltage circuit 17A boosts the voltage of the selected bit line voltage VBL at a faster speed than the constant current circuit 17B. Thus, the magnetic memory device 1 according to the embodiment, which can use the constant voltage circuit 17A, can shorten the time taken to start reading, compared to the case where reading is performed using only a constant current circuit as in the comparative example.

Next, a voltage V1 will be described. As described above, the voltage V1 is larger than the half-selection voltage Vusel and smaller than the threshold voltage VTH. The voltage V1 can be set to any value that is larger than the half-selection voltage Vusel and smaller than the threshold voltage VTH. As the voltage V1 becomes a value closer to the threshold voltage VTH, the period of time during which the selected bit line voltage VBL is boosted by the constant voltage circuit 17A becomes longer. As the period of time during which the selected bit line voltage VBL is boosted by the constant voltage circuit 17A becomes longer, the time taken to start reading can be shortened.

However, since the threshold voltage VTH of the switching element SE varies to some degree according to the memory cell MC, if the value of V1 were too close to the threshold voltage VTH, the switching elements SE with lower threshold voltages VTH would be turned on by the constant-voltage driver control signal CV17. If the switching element SE were turned on by the constant-voltage driver control signal CV17 that rapidly enlarges the selected bit line voltage VBL, it would be difficult to control the switching element SE.

Conversely, if the value of the voltage V1 were too close to the half-selection voltage Vusel, the period of time during which the voltage of the selected bit line voltage VBL is boosted by the constant voltage circuit 17A would be shortened. If the period of time during which the voltage of the selected bit line voltage VBL is boosted by the constant voltage circuit 17A were shortened, the effect of reducing the time taken to start reading might be lowered.

Accordingly, it is desirable that the value of the voltage V1 be a largest possible value but is not as long as causing the switching element SE to be turned on by the constant-voltage driver control signal CV17.

The above-described effect similarly applies to a write operation, and the magnetic memory device 1 according to the embodiment, which can use the constant voltage circuit 16A, can shorten the time taken to start writing, compared to the case where writing is performed using only a constant current circuit as in the comparative example.

[2] Other Modifications, Etc (First Modification)

A timing chart of a magnetic memory device 1 according to a first modification of the embodiment differs from the timing chart of the magnetic memory device 1 according to the embodiment. Hereinafter, the magnetic memory device 1 according to the first modification of the embodiment may be referred to as a "magnetic memory device 1b" for distinction from the magnetic memory device 1 according to the embodiment.

Figure 21:
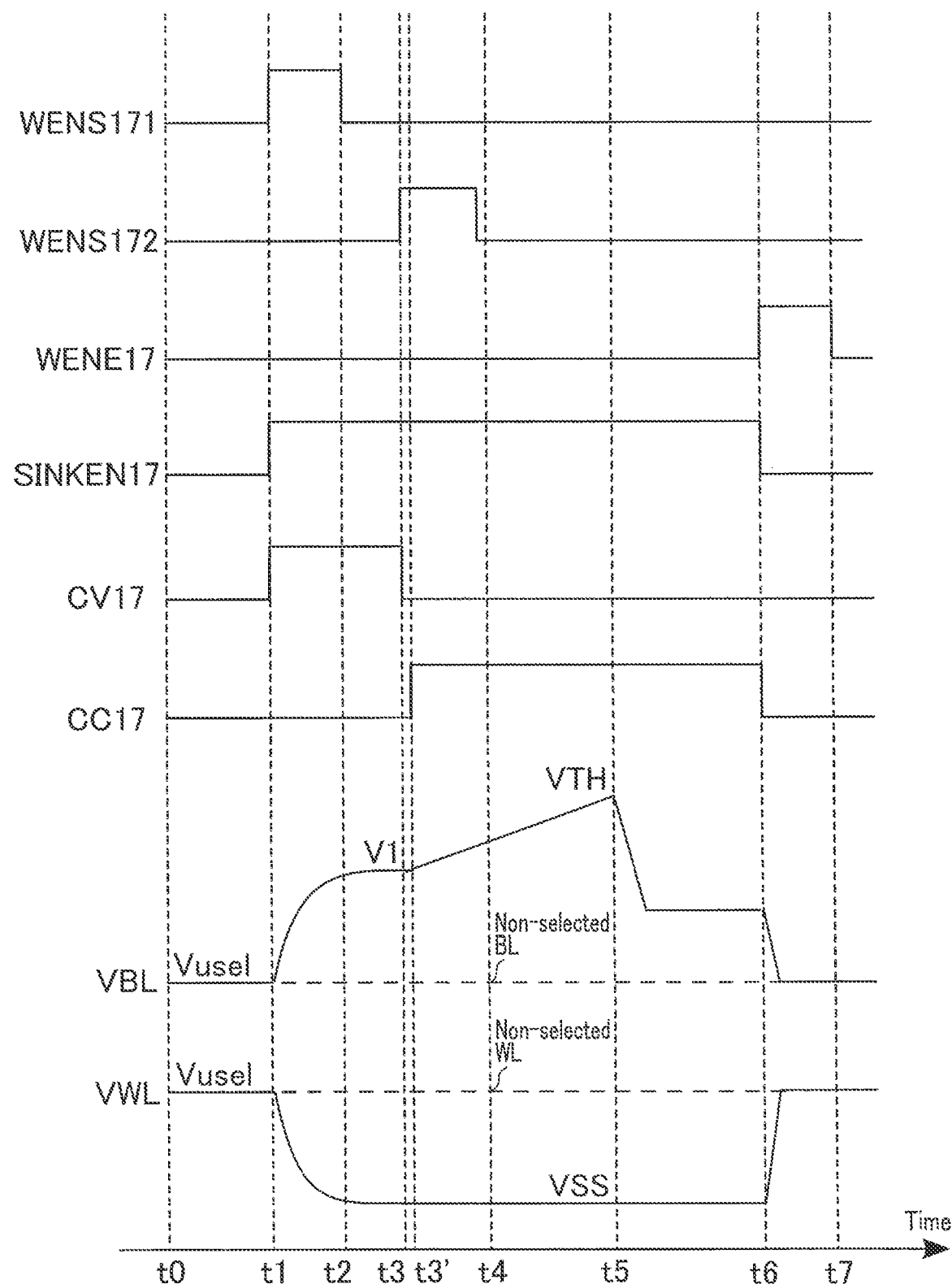
FIG. 21 is a timing chart showing a state of a signal during data reading of a magnetic memory device according to a first modification of the embodiment.

FIG. 21 is a timing chart showing, along a timeline, states of some signals during data reading of the magnetic memory device 1b according to the first modification of the embodiment. Control signals WENS171, WENS172, WENE17, SINKEN17, a constant-voltage driver control signal CV17, a constant-current driver control signal CC17, a selected bit line voltage VBL, a selected word line voltage VWL, a non-selected bit line voltage VBLusel, and a non-selected word line voltage VWLusel are the same as those described with reference to FIG. 11, and a description thereof will be omitted.

In the magnetic memory device 1 according to the embodiment described above, a case has been illustrated where, at time t3, the selected bit line BL is decoupled from the constant voltage circuit 17A and coupled to the constant current circuit 17B. In the magnetic memory device 1b according to the first modification, the selected bit line BL is decoupled from the constant voltage circuit 17A at time t3, and is then coupled to the constant current circuit 17B at time t3' later than time t3.

During the period, for example, from when the control signal WENS172 is turned on at time t3 until the constant-current driver control signal CC17 is turned on, there may be a case where an unintended delay in signal transmission time, etc. occurs. In this case, the constant-current driver control signal CC17 is turned on at time t3' later than time t3.

(Second Modification)

The above-described first modification similarly applies to a write operation. A timing chart of a magnetic memory device 1 according to a second modification of the embodiment differs from the timing chart of the magnetic memory device 1 according to the embodiment. Hereinafter, the magnetic memory device 1 according to the second modification of the embodiment may be referred to as a "magnetic memory device 1c" for distinction from the magnetic memory device 1 according to the embodiment.

Figure 22:
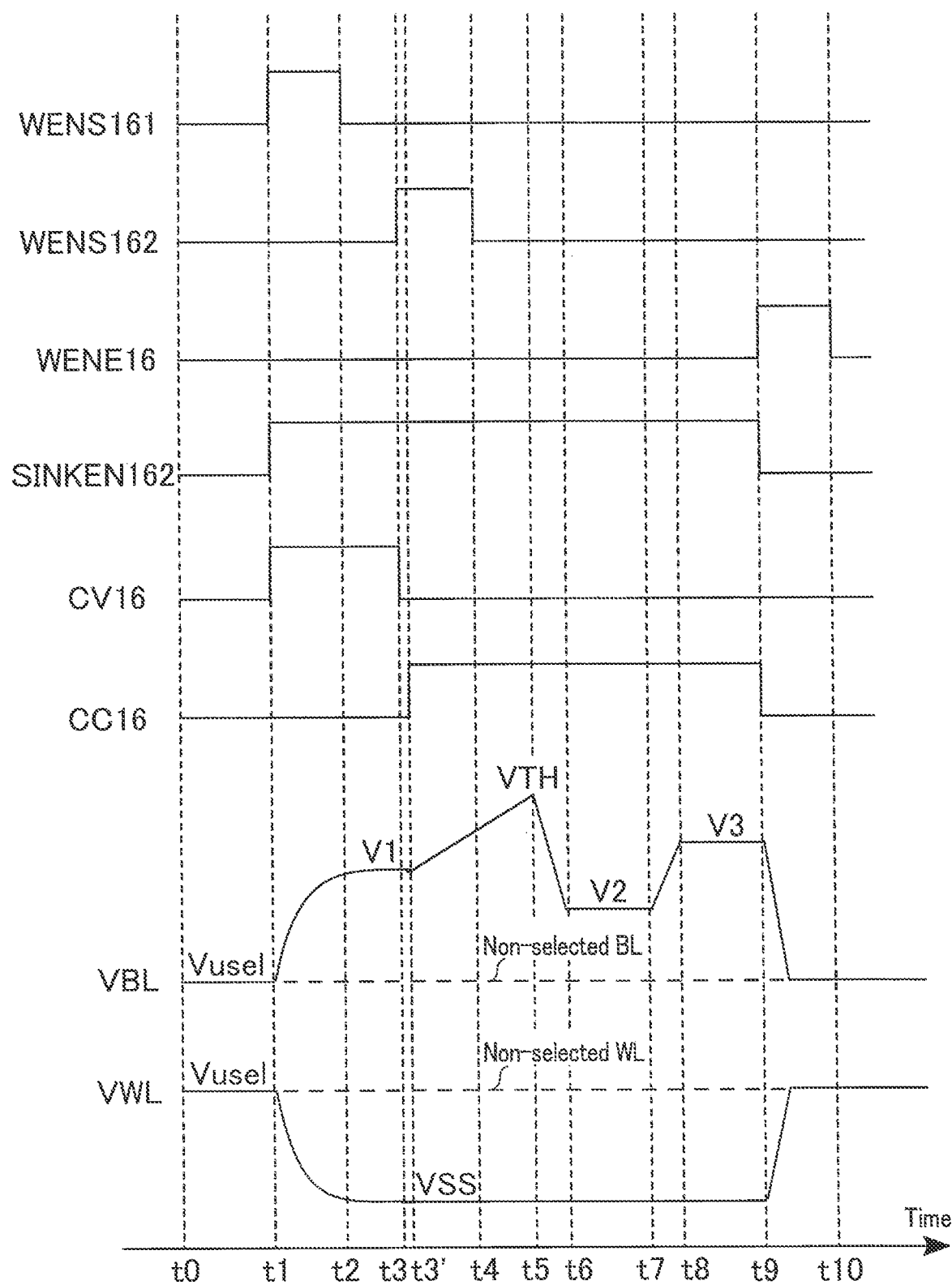
FIG. 22 is a timing chart showing states of signals during data writing of a magnetic memory device according to a second modification of the embodiment.

FIG. 22 is a timing chart showing, along a timeline, states of some signals during data writing of the magnetic memory device 1c according to the second modification of the embodiment. Control signals WENS161, WENS162, WENE16, and SINKEN162, a constant-voltage driver control signal CV16, a constant-current driver control signal CC16, a selected bit line voltage VBL, a selected word line voltage VWL, a non-selected bit line voltage VBLusel, and a non-selected word line voltage VWLusel are similar to those described with reference to FIG. 14, and a description thereof will be omitted.

In the magnetic memory device 1 according to the embodiment described above, a case has been illustrated where, at time t3, the selected bit line BE is decoupled from the constant voltage circuit 16A and is coupled to the constant current circuit 16B. In the magnetic memory device 1c according to the second modification, the selected bit line BL is decoupled from the constant voltage circuit 16A at time t3, and is then coupled to the constant current circuit 16B at time t3' later than time t3.

During the period, for example, from when the control signal WENS162 is turned on at time t3 until the constant-current driver control signal CC16 is turned on, there may be a case where an unintended delay in signal transmission time, etc. occurs. In this case, the constant-current driver control signal CC16 is turned on at time t3' later than time t3.

In the embodiment, the magnetic memory devices 1, 1b, and 1c may have other structures.

Herein, the term "couple" refers to electrical coupling, and does not exclude intervention of another element. Electrical coupling may be via by an insulator as long as such coupling is capable of operating in a manner similar to electrical coupling without intervention of an insulator.

The embodiments described above have been presented by way of example only, and are not intended to limit the scope of the invention. The embodiments may be embodied in a variety of other forms, and various omissions, substitutions and changes may be made without departing from the spirit of the invention. The embodiments and their modifications are included in the scope and spirit of the invention and are included in the scope of the claimed inventions and their equivalents.

The invention claimed is:

1. A magnetic memory device, comprising:
a first interconnect which extends in a first direction;
a second interconnect which extends in a second direction that intersects the first direction;
a memory cell which is electrically coupled between the first interconnect and the second interconnect, and which includes a variable resistance element and a switching element; and
a write circuit which includes a current source circuit and a voltage source circuit, and supplies a write voltage from the current source circuit or the voltage source circuit to write data into the memory cell,
wherein
the write circuit is configured, while a first voltage which is lower than the write voltage is applied to one of the first interconnect and the second interconnect, to:
supply the write voltage to another of the first interconnect and the second interconnect using the voltage source circuit during a first period ranging from a first time when supplying of the write voltage is started to a second time; and supply the write voltage to said another of the first interconnect and the second interconnect using the current source circuit during a second period ranging from a third time which is later than the second time to a fourth time when the supplying of the write voltage is stopped, and a second voltage which is higher than the first voltage and lower than the write voltage is applied to the first interconnect and the second interconnect at a time prior to the first time.

2. The magnetic memory device according to claim 1, wherein said another of the first interconnect and the second interconnect has a third voltage at the second time, and the third voltage is lower than a voltage that turns on the switching element, and is larger than the second voltage.

3. The magnetic memory device according to claim 2, wherein the third voltage is closer to the voltage that turns on the switching element than the second voltage.

4. The magnetic memory device according to claim 1, further comprising:

a read circuit which includes a second current source circuit and a second voltage source circuit, and supplies a read voltage from the second current source circuit or the second voltage source circuit to read data from the memory cell, wherein the read circuit is configured, while the first voltage is applied to one of the first interconnect and the second interconnect, to:

supply the read voltage to another of the first interconnect and the second interconnect using the second voltage source circuit during a third period ranging from a fifth time when supplying of the read voltage is started to a sixth time; and supply the read voltage to said another of the first interconnect and the second interconnect using the second current source circuit during a fourth period ranging from a seventh time which is later than the sixth time to an eighth time when the supplying of the read voltage is stopped.

5. The magnetic memory device according to claim 1, wherein the first period includes a period during which an increase in a voltage value per unit time in another of the first interconnect and the second interconnect is larger than that of the second period.

6. A magnetic memory device, comprising:

a first interconnect which extends in a first direction;

a second interconnect which extends in a second direction that intersects the first direction;

a memory cell which is electrically coupled between the first interconnect and the second interconnect, and which includes a variable resistance element and a switching element; and a write circuit which supplies a write voltage to write data into the memory cell, wherein the write circuit includes:

a first transistor electrically coupled between a voltage source and a first node;

a second transistor electrically coupled between a current source and the first node;

a third transistor electrically coupled between the first node and the first interconnect;

a fourth transistor electrically coupled between the first node and the second interconnect;

a fifth transistor electrically coupled between the first interconnect and a first power supply which supplies a voltage lower than a voltage of the voltage source; and a sixth transistor electrically coupled between the second interconnect and the first power supply, and the write circuit is configured, while a first voltage which is lower than the write voltage is applied to one of the first interconnect and the second interconnect, to:

supply the write voltage to another of the first interconnect and the second interconnect using the first transistor during a first period ranging from a first time when supplying of the write voltage is started to a second time; and supply the write voltage to said another of the first interconnect and the second interconnect using the second transistor during a second period ranging from a third time which is later than the second time to a fourth time when the supplying of the write voltage is stopped.

7. The magnetic memory device according to claim 6, wherein a control terminal of the first transistor receives a first signal during the first period, a control terminal of the second transistor receives a second signal during the second period, a control terminal of the third transistor receives a third signal during a third period during which the first voltage is applied to one of the first interconnect and the second interconnect, and a control terminal of the sixth transistor receives a fourth signal during the third period.

8. The magnetic memory device according to claim 6, wherein a control terminal of the first transistor receives a first signal during the first period, a control terminal of the second transistor receives a second signal during the second period, a control terminal of the fourth transistor receives a third signal during a third period during which the first voltage is applied to one of the first interconnect and the second interconnect, and a control terminal of the fifth transistor receives a fourth signal during the third period.

9. The magnetic memory device according to claim 6, wherein a second voltage which is higher than the first voltage and lower than the write voltage is applied to the first interconnect and the second interconnect at a time prior to the first time.

10. The magnetic memory device according to claim 9, wherein said another of the first interconnect and the second interconnect has a third voltage at the second time, and the third voltage is lower than a voltage that turns on the switching element, and is larger than the second voltage.

11. The magnetic memory device according to claim 10, wherein the third voltage is closer to a voltage that turns on the switching element than the second voltage.

12. The magnetic memory device according to claim 6, wherein the first period includes a period during which an increase in a voltage value per unit time in another of the first interconnect and the second interconnect is larger than that of the second period.

13. A magnetic memory device, comprising:
a first interconnect which extends in a first direction;
a second interconnect which extends in a second direction that intersects the first direction;
a memory cell which is electrically coupled between the first interconnect and the second interconnect, and which includes a variable resistance element and a switching element; and
a read circuit which includes a current source circuit and a voltage source circuit, and supplies a read voltage from the current source circuit or the voltage source circuit to read data from the memory cell,
wherein
the read circuit is configured, while a first voltage which is lower than the read voltage is applied to one of the first interconnect and the second interconnect, to:
supply the read voltage to another of the first interconnect and the second interconnect using the voltage source circuit during a first period ranging from a first time when supplying of the read voltage is started to a second time; and
supply the read voltage to said another of the first interconnect and the second interconnect using the current source circuit during a second period ranging from a third time which is later than the second time to a fourth time when the supplying of the read voltage is stopped.

14. The magnetic memory device according to claim 13, wherein
the read circuit includes:
a first transistor electrically coupled between a voltage source and a first node;
a second transistor electrically coupled between a current source and the first node; and
a third transistor electrically coupled between the first interconnect and a ground power supply.

15. The magnetic memory device according to claim 14, wherein
a control terminal of the first transistor receives a first signal during the first period,
a control terminal of the second transistor receives a second signal during the second period, and
a control terminal of the third transistor receives a third signal during a third period during which the first voltage is applied to one of the first interconnect and the second interconnect.

16. The magnetic memory device according to claim 13, wherein
a second voltage which is higher than the first voltage and lower than the read voltage is applied to the first interconnect and the second interconnect at a time prior to the first time.

17. The magnetic memory device according to claim 16, wherein
said another of the first interconnect and the second interconnect has a third voltage at the second time, and
the third voltage is lower than a voltage that turns on the switching element, and is larger than the second voltage.

18. The magnetic memory device according to claim 17, wherein
the third voltage is closer to a voltage that turns on the switching element than the second voltage.

19. The magnetic memory device according to claim 13, wherein
the first period includes a period during which an increase in a voltage value per unit time in another of the first interconnect and the second interconnect is larger than that of the second period.

20. A magnetic memory device, comprising:
a first interconnect which extends in a first direction;
a second interconnect which extends in a second direction that intersects the first direction;
a memory cell which is electrically coupled between the first interconnect and the second interconnect, and which includes a variable resistance element and a switching element;
a write circuit which includes a current source circuit and a voltage source circuit, and supplies a write voltage from the current source circuit or the voltage source circuit to write data into the memory cell; and
a read circuit which includes a second current source circuit and a second voltage source circuit, and supplies a read voltage from the second current source circuit or the second voltage source circuit to read data from the memory cell,
wherein
the write circuit is configured, while a first voltage which is lower than the write voltage is applied to one of the first interconnect and the second interconnect, to:
supply the write voltage to another of the first interconnect and the second interconnect using the voltage source circuit during a first period ranging from a first time when supplying of the write voltage is started to a second time; and
supply the write voltage to said another of the first interconnect and the second interconnect using the current source circuit during a second period ranging from a third time which is later than the second time to a fourth time when the supplying of the write voltage is stopped, and
the read circuit is configured, while the first voltage is applied to one of the first interconnect and the second interconnect, to:
supply the read voltage to another of the first interconnect and the second interconnect using the second voltage source circuit during a third period ranging from a fifth time when supplying of the read voltage is started to a sixth time; and
supply the read voltage to said another of the first interconnect and the second interconnect using the second current source circuit during a fourth period ranging from a seventh time which is later than the sixth time to an eighth time when the supplying of the read voltage is stopped.

21. A magnetic memory device, comprising:
a first interconnect which extends in a first direction;
a second interconnect which extends in a second direction that intersects the first direction;
a memory cell which is electrically coupled between the first interconnect and the second interconnect, and which includes a variable resistance element and a switching element; and
a write circuit which includes a current source circuit and a voltage source circuit, and supplies a write voltage from the current source circuit or the voltage source circuit to write data into the memory cell, wherein
the write circuit is configured, while a first voltage which is lower than the write voltage is applied to one of the first interconnect and the second interconnect, to:
supply the write voltage to another of the first interconnect and the second interconnect using the voltage source circuit during a first period ranging from a first time when supplying of the write voltage is started to a second time; and
supply the write voltage to said another of the first interconnect and the second interconnect using the current source circuit during a second period ranging from a third time which is later than the second time to a fourth time when the supplying of the write voltage is stopped, and
the first period includes a period during which an increase in a voltage value per unit time in another of the first interconnect and the second interconnect is larger than that of the second period.

\* \* \* \* \*